United States Patent [19]
Hata et al.

[11] Patent Number: 6,091,083
[45] Date of Patent: Jul. 18, 2000

[54] GALLIUM NITRIDE TYPE COMPOUND SEMICONDUCTOR LIGHT-EMITTING DEVICE HAVING BUFFER LAYER WITH NON-FLAT SURFACE

[75] Inventors: Toshio Hata, Nara; Satoshi Sugahara, Kashihara; Daisuke Hanaoka, Tenri, all of Japan

[73] Assignee: Sharp Kabushiki Kaisha, Japan

[21] Appl. No.: 09/088,222

[22] Filed: Jun. 1, 1998

[30] Foreign Application Priority Data

| Jun. 2, 1997 | [JP] | Japan | 9-144326 |
| Jun. 27, 1997 | [JP] | Japan | 9-170822 |

[51] Int. Cl.$^7$ ................................. H01L 27/15
[52] U.S. Cl. .......................... 257/79; 257/76; 257/97; 257/190; 257/196; 257/201; 257/615; 257/618; 257/622; 257/623; 372/45; 372/46
[58] Field of Search .............................. 257/23, 76, 79, 257/94, 96, 97, 101, 103, 183, 190, 196, 201, 613, 615, 618, 622, 623; 372/45, 43, 46, 47, 48, 49

[56] References Cited

U.S. PATENT DOCUMENTS

| 5,309,472 | 5/1994 | Kudo et al. | 372/96 |
| 5,665,986 | 9/1997 | Miura et al. | 257/96 |
| 5,814,839 | 9/1998 | Hosoba | 257/96 |
| 5,880,485 | 3/1999 | Marx et al. | 257/94 |
| 5,909,040 | 6/1999 | Ohba et al. | 257/190 |

FOREIGN PATENT DOCUMENTS

| 8-107247 | 4/1976 | Japan . |
| 11-17272 | 1/1999 | Japan . |

OTHER PUBLICATIONS

Itaya, K. et al. "Room Temperature Pulsed Operation of Nitride Based Multi–Quantum–Well Laser Diodes with Cleaved Facets on Conventional C–Face Sapphire Substrates" *Appl. Phys.* (1996) 35:1315–1317.

*Primary Examiner*—Jerome Jackson, Jr.
*Assistant Examiner*—Bradley W. Baumeister
*Attorney, Agent, or Firm*—Morrison & Foerster LLP

[57] ABSTRACT

A gallium nitride type compound semiconductor light-emitting device of the present invention includes: a substrate; a buffer layer, formed on the substrate, having a thick region and a thin region in terms of a thickness taking a surface of the substrate as a reference level; and a semiconductor layered structure, formed on the buffer layer, at least including an undoped gallium nitride type compound semiconductor layer, a gallium nitride type compound semiconductor active layer, and a P-type gallium nitride type compound semiconductor cladding layer.

20 Claims, 14 Drawing Sheets

1000

5000

PRIOR ART

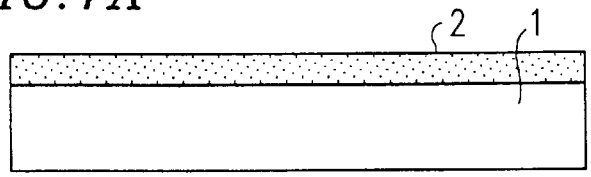
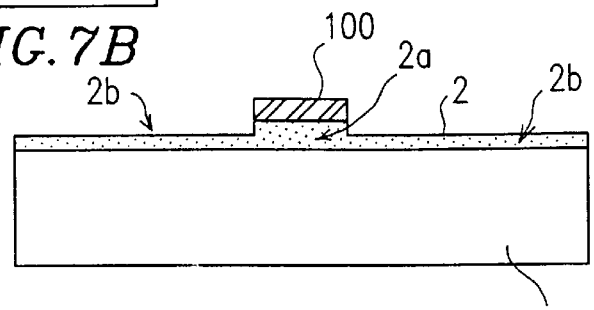
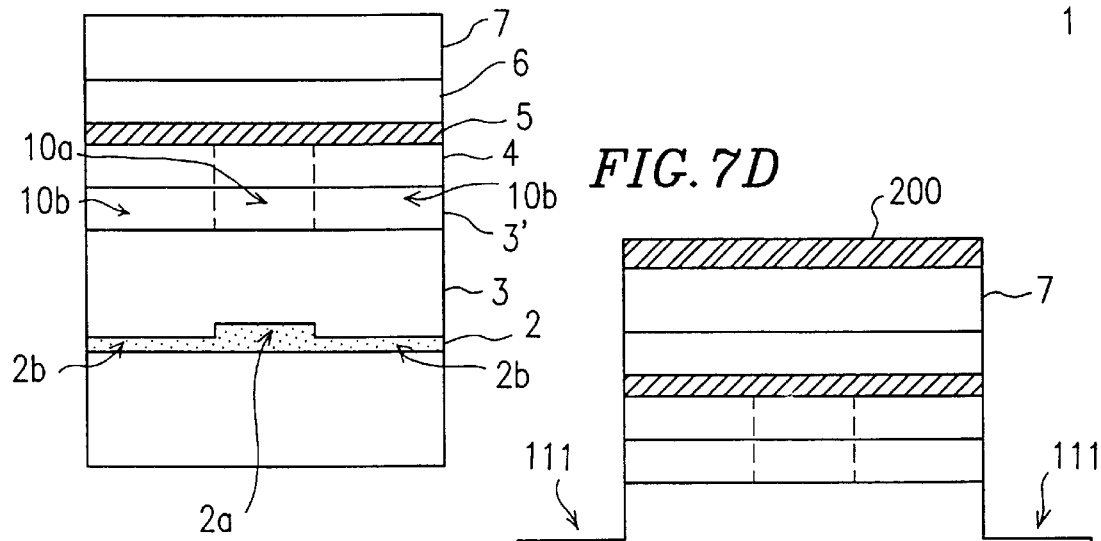
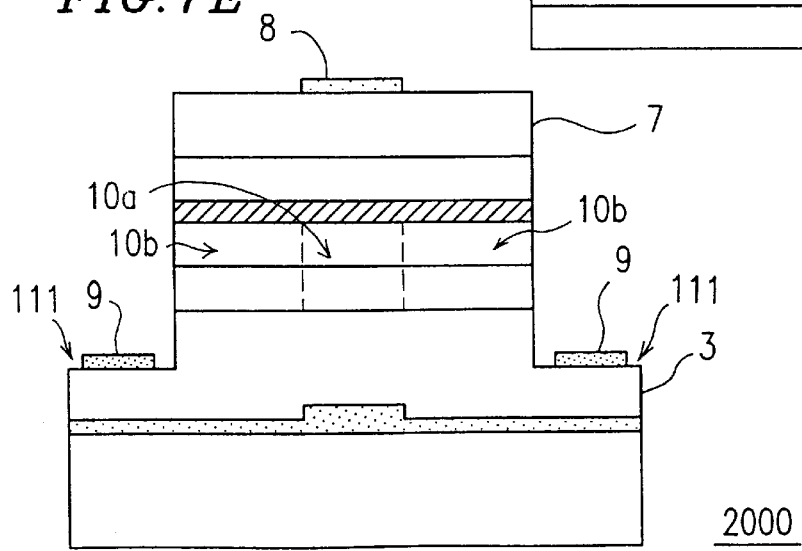

6000

7000

8000

GALLIUM NITRIDE TYPE COMPOUND SEMICONDUCTOR LIGHT-EMITTING DEVICE HAVING BUFFER LAYER WITH NON-FLAT SURFACE

BACKGROUND OF THE INVENTION

1. Field of the Invention

The present invention relates to a gallium nitride type compound semiconductor light-emitting device, such as a semiconductor laser or a light-emitting diode, capable of emitting light from the blue region to the ultraviolet region; and a method for fabricating the same.

2. Description of the Related Art

One conventional example of a gallium nitride type compound semiconductor laser of a current constricting type is disclosed in Japanese Laid-open Publication No. 8-107247. FIG. 1 is a cross-sectional view schematically illustrating the structure of a semiconductor laser 800 disclosed in the aforementioned Japanese Laid-open Publication. Hereinafter, the structure of the semiconductor laser 800 will be described along with the fabrication process thereof.

First, a sapphire substrate (i.e., a wafer) 1 is introduced into a MOCVD apparatus. Thereafter, a GaN buffer layer 2, an N-type GaN layer 3, an N-type AlGaN cladding layer 4, an undoped InGaN active layer 5, a P-type AlGaN cladding layer 6, and N/P/N type GaN current constricting layers 20 are sequentially provided on the sapphire substrate 1 in this order. Subsequently, the wafer 1 with the above-described layered structure is taken out from the MOCVD apparatus. Then, part of the layered structure is removed by etching until the N-type GaN layer 3 is exposed. A striped groove 21 is formed through the N/P/N type GaN current constricting layers 20 by etching. Next, the resultant wafer 1 is re-introduced into a growth chamber of the MOCVD apparatus, for regrowing a P-type GaN contact layer 7 so as to fill the groove 21. Thereafter, a P-side electrode 8 is formed on the P-type GaN contact layer 7. Moreover, an N-side electrode 9 is formed on the exposed surface of the N-type GaN layer 3 formed by the aforementioned etching.

By performing the above-described fabrication process, the gallium nitride type compound semiconductor laser 800 with the cross-sectional structure shown in FIG. 1 is completed.

However, the semiconductor laser 800 disclosed in Japanese Laid-open Publication No. 8-107247 has problems, as described below.

First, in the dry etching for forming the groove 21, stopping the etching at an appropriate timing when the surface of the P-type AlGaN cladding layer 6 is just exposed requires a high degree of controll, and it is therefore difficult to carry out such an etching control.

Second, according to the aforementioned fabrication process, it is necessary to re-introduce the wafer with the striped groove 21 provided in the current constricting layers 20 into the MOCVD apparatus and to regrow the P-type GaN contact layer 7 so as to cover the striped groove 21. During such a step, however, high resistance due to surface roughness or the like is generated in the vicinity of the regrowth interface between the regrown P-type GaN contact layer 7 and the P-type AlGaN cladding layer 6. As a result, series resistance in the light-emitting device is increased, thereby increasing its driving voltage and deteriorating reliability of the light-emitting device.

On the other hand, one conventional example of a gallium nitride type compound semiconductor laser of a striped electrode type is disclosed in the Japanese Journal of Applied Physics, Vol. 35, pp. L1315–L1317 (1996). FIG. 2 is a cross-sectional view schematically illustrating the structure of a semiconductor laser 900 disclosed in the aforementioned article. Hereinafter, the structure of the semiconductor laser 900 will be described along with the fabrication process thereof.

First, a sapphire substrate 1 is introduced into a MOCVD apparatus. Thereafter, a GaN buffer layer 2, an N-type GaN layer 3, an N-type AlGaN cladding layer 4, an undoped GaN layer 4', an undoped InGaN multi quantum-well active layer 5, a P-type GaN layer 6', a P-type AlGaN cladding layer 6, and a P-type GaN contact layer 7 are sequentially provided on the sapphire substrate 1 in this order. Subsequently, part of the layered structure is removed by etching until the N-type GaN layer 3 is exposed. Thereafter, a $SiO_2$ insulating layer 30 which covers the upper surface of the P-type GaN contact layer 7 and side surfaces of the layered structure remained after the etching is formed. Next, after removing a part of the $SiO_2$ insulating layer 30 on the P-type GaN contact layer 7, a P-side electrode 8 is formed so as to be electrically connected to the exposed part of the P-type GaN contact layer 7. Moreover, an N-side electrode 9 is formed on the exposed surface of the N-type GaN layer 3 formed by the aforementioned etching.

By performing the above-described fabrication process, the gallium nitride type compound semiconductor laser 900 with the cross-sectional structure shown in FIG. 2 is completed.

However, the semiconductor laser 900 described in the aforementioned article has problems as described hereinafter.

First, according to the above-described structure, a current spreads, thereby increasing an oscillation starting current. As a result, it is difficult to reduce the oscillation starting current or to control its light-emitting pattern.

Moreover, since the step of forming the $SiO_2$ insulating layer 30 is required upon the fabrication, the fabrication process is complicated, thereby increasing its production cost.

SUMMARY OF THE INVENTION

A gallium nitride type compound semiconductor light-emitting device of the present invention includes: a substrate; a buffer layer formed on the substrate and having a thick region and a thin region in terms of a thickness taking a surface of the substrate as a reference level; and a semiconductor layered structure formed on the buffer layer and at least including an undoped gallium nitride type compound semiconductor layer, a gallium nitride type compound semiconductor active layer, and a P-type gallium nitride type compound semiconductor cladding layer.

The thin region of the buffer layer may be positioned below a light-emitting region of the gallium nitride type compound semiconductor active layer; and the thick region may be positioned below a non-light-emitting region of the gallium nitride type compound semiconductor active layer.

Specifically, a portion of the undoped gallium nitride type compound semiconductor layer, which is positioned above the thick region of the buffer layer, has a carrier concentration smaller than that of a region thereof positioned above the thin region.

The thin region of the buffer layer may be formed by etching.

The undoped gallium nitride type compound semiconductor layer may be positioned closer to the substrate than the gallium nitride type compound semiconductor active layer is to the substrate.

The undoped gallium nitride type compound semiconductor layer, the gallium nitride type compound semiconductor active layer, and the P-type gallium nitride type compound semiconductor cladding layer may be crystal grown in this order on the buffer layer.

In one embodiment, an N-type gallium nitride type compound semiconductor layer is further provided between the buffer layer and the undoped gallium nitride type compound semiconductor layer.

The undoped gallium nitride type compound semiconductor layer may include an undoped gallium nitride type compound semiconductor cladding layer.

For example, the undoped gallium nitride type compound semiconductor layer may include a layered structure of a GaN layer and an AlGaN layer.

Another aspect of the present invention provides a method for fabricating a gallium nitride type compound semiconductor light-emitting device. The method includes the steps of: forming a buffer layer on a substrate; etching a predetermined portion of the buffer layer so as to form a thick region and a thin region in terms of a thickness taking a surface of the substrate as a reference level; forming an undoped gallium nitride type compound semiconductor layer on the buffer layer; and forming an active layer, a P-type cladding layer, and a P-type contact layer in this order on the undoped gallium nitride type compound semiconductor layer.

In one embodiment, the method further includes the step of forming an N-type gallium nitride type compound semiconductor layer between the buffer layer and the undoped gallium nitride type compound semiconductor layer.

The undoped gallium nitride type compound semiconductor layer may be formed so as to include an undoped gallium nitride type compound semiconductor cladding layer.

For example, the undoped gallium nitride type compound semiconductor layer may be formed so as to include a layered structure of a GaN layer and an AlGaN layer.

According to still another aspect of the present invention, a gallium nitride type compound semiconductor light-emitting device includes: a substrate with a processed region which is processed such that a surface thereof has a predetermined concave and convex pattern; a buffer layer formed on the substrate; and a semiconductor layered structure, formed on the buffer layer, at least including an undoped gallium nitride type compound semiconductor layer, a gallium nitride type compound semiconductor active layer, and a P-type gallium nitride type compound semiconductor cladding layer.

The processed region of the substrate may be positioned below a light-emitting region of the gallium nitride type compound semiconductor active layer.

Specifically, a portion of the undoped gallium nitride type compound semiconductor layer, which is positioned above the processed region of the substrate, has a resistivity smaller than that of a portion thereof positioned above a non-processed region.

The undoped gallium nitride type compound semiconductor layer may be positioned closer to the substrate than the gallium nitride type compound semiconductor active layer is to the substrate.

The undoped gallium nitride type compound semiconductor layer, the gallium nitride type compound semiconductor active layer, and the P-type gallium nitride type compound semiconductor cladding layer may be crystal grown in this order on the buffer layer.

In one embodiment, an N-type gallium nitride type compound semiconductor layer is further provided between the buffer layer and the undoped gallium nitride type compound semiconductor layer.

The undoped gallium nitride type compound semiconductor layer may include an undoped gallium nitride type compound semiconductor cladding layer.

For example, the undoped gallium nitride type compound semiconductor layer may include a layered structure of a GaN layer and an AlGaN layer.

Still another aspect of the present invention provides another method for fabricating a gallium nitride type compound semiconductor light-emitting device. The method includes the steps of: forming a concave and convex pattern in a predetermined region on a surface of a substrate by etching; forming a buffer layer on the substrate; forming an undoped gallium nitride type compound semiconductor layer on the buffer layer; and forming an active layer, a P-type cladding layer, and a P-type contact layer in this order on the undoped gallium nitride type compound semiconductor layer.

In one embodiment, the method further includes the step of forming an N-type gallium nitride type compound semiconductor layer between the buffer layer and the undoped gallium nitride type compound semiconductor layer.

The undoped gallium nitride type compound semiconductor layer may be formed so as to include an undoped gallium nitride type compound semiconductor cladding layer.

For example, the undoped gallium nitride type compound semiconductor layer may be formed so as to include a layered structure of a GaN layer and an AlGaN layer.

Thus, the invention described herein makes possible the advantages of (1) providing a highly reliable gallium nitride type compound semiconductor light-emitting device exhibiting reduced oscillation starting current and operating voltage; and (2) providing a method for fabricating the same.

These and other advantages of the present invention will become apparent to those skilled in the art upon reading and understanding the following detailed description with reference to the accompanying figures.

BRIEF DESCRIPTION OF THE DRAWINGS

FIGS. 7A to 7E are cross-sectional views for schematically describing each of fabrication steps for forming the semiconductor light-emitting device shown in FIG. 6;

DESCRIPTION OF THE PREFERRED EMBODIMENTS

Hereinafter, the present invention will be described by way of illustrative, but non-limiting examples, with reference to the accompanying drawings. In this specification, "a gallium nitride type compound semiconductor" includes, for example, $In_xAl_yGa_{1-x-y}N$ ($0 \leq x$, $0 \leq y$, $x+y \leq 1$). Moreover, "a semiconductor light-emitting device" herein includes a semiconductor laser and a light-emitting diode.

According to each of embodiments described below, a semiconductor light-emitting device is fabricated typically using a metal organic metal chemical vapor deposition (MOCVD) method. In addition, typically, a sapphire substrate is used as a substrate. Ammonia ($NH_3$) is used as a Group V material; trimethylgallium (TMG), trimethylaluminum (TMA), and trimethylindium (TMIn) are used as Group III materials; monosilane ($SiH_4$) is used as an N-type impurity; bisdichlopentadienylmagnesium ($Cp_2Mg$) is used as a P-type impurity; and $H_2$ or $N_2$ is used as a carrier gas. However, the application of the present invention is not limited to the above-described process and materials.

(Embodiment 1)

Figure 3:
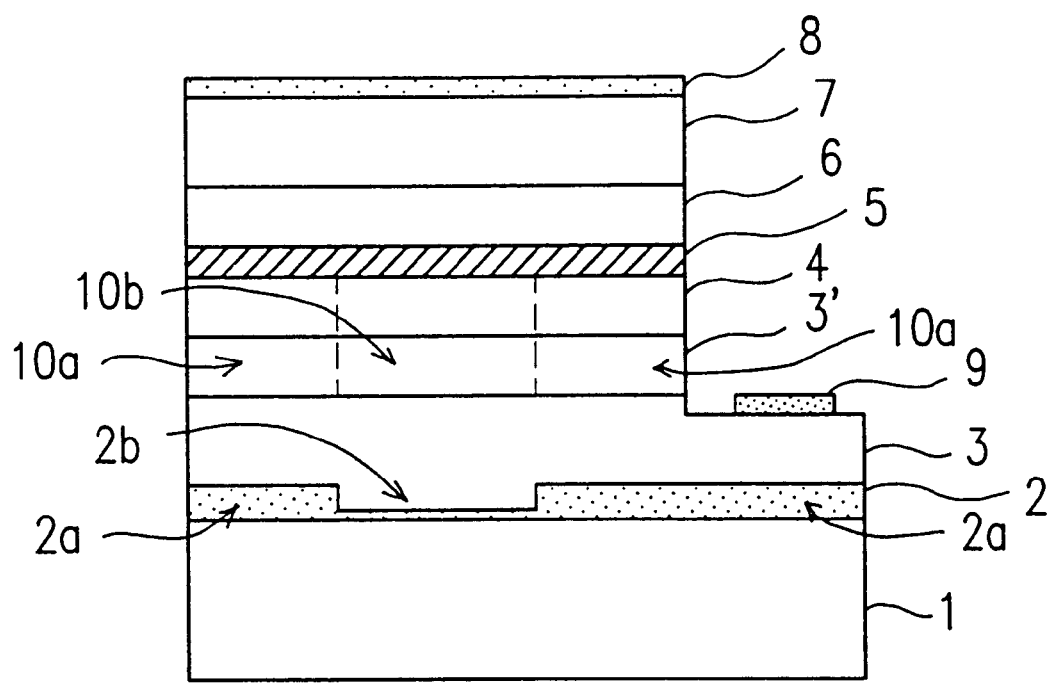
FIG. 3 is a cross-sectional view schematically illustrating the structure of a gallium nitride type compound semiconductor light-emitting device (semiconductor laser) of a current constricting type according to Embodiment 1 of the present invention.

FIG. 3 is a cross-sectional view schematically illustrating the structure of a gallium nitride type compound semiconductor laser 1000 of a current constricting type as a semiconductor light-emitting device according to Embodiment 1 of the present invention. FIGS. 4A to 4E are cross-sectional views sequentially showing fabrication steps of the semiconductor laser 1000.

Hereinafter, the structure of the semiconductor laser 1000 and the fabrication process thereof will be described.

Figure 4A:
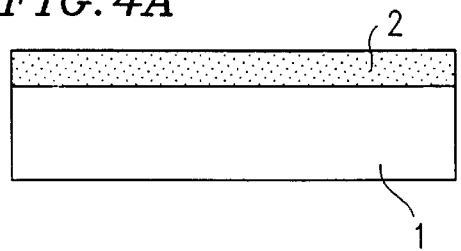
FIGS. 4A to 4E are cross-sectional views for schematically describing each of fabrication steps for forming the semiconductor light-emitting device (semiconductor laser) shown in FIG. 3.

First, the sapphire substrate 1 is introduced onto a susceptor (not shown) of a MOCVD apparatus. While raising the temperature of the substrate 1 to about 1200° C., the sapphire substrate 1 is exposed to an $N_2$ or $H_2$ atmosphere. Next, the temperature of the sapphire substrate 1 is lowered to a temperature of about 400° C. to about 650° C. Thereafter, as shown in FIG. 4A, a buffer layer 2 (an AlN buffer layer 2 in this embodiment) generally made of $Al_xGa_{1-x}N$ ($0 \leq x \leq 1$) is grown on the sapphire substrate 1 so as to have a thickness of about 50 nm.

Figure 4B:
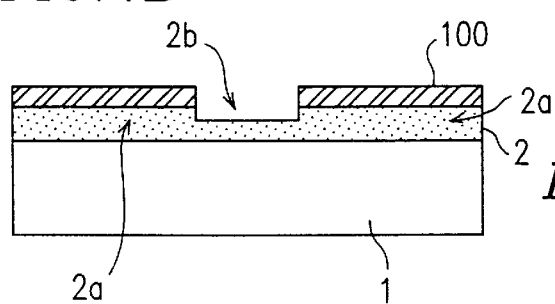
Figure 4C:
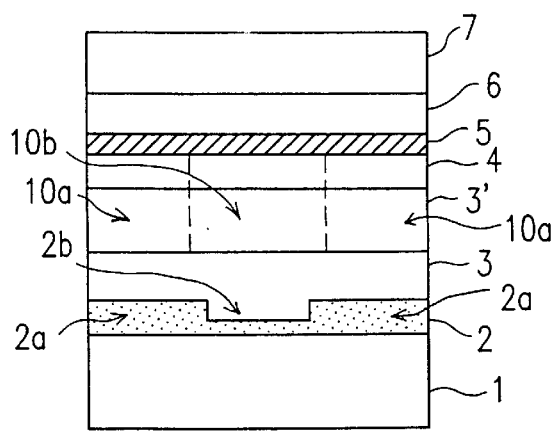

Next, the resultant wafer is taken out from the MOCVD apparatus, and as shown in FIG. 4B, a resist mask 100 having a predetermined pattern is formed on the AlN buffer layer 2 using an ordinary photolithography technique. Using the resist mask 100, the AlN buffer layer 2 is etched so as to form thick buffer layer regions 2a and a thin buffer layer region 2b. More specifically, as shown in FIG. 4B, the thin buffer layer region 2b is formed at a center portion of the AlN buffer layer 2, and the thick buffer layer regions 2a are formed so as to interpose the thin buffer layer region 2b therebetween.

Next, after removing the resist mask 100, the wafer is re-introduced onto the susceptor of the MOCVD apparatus. The substrate temperature is raised to about 1050° C., thereby growing a Si-doped N-type GaN layer 3 with a thickness of about 0.5 μm to about 2 μm on the AlN buffer layer 2. Subsequently, an undoped GaN layer 3' is grown thereon so as to have a thickness of about 2 μm. Thereafter, an undoped $Al_{0.1}Ga_{0.9}N$ cladding layer 4 is grown thereon so as to have a thickness of about 0.1 μm to about 0.3 μm.

Next, the substrate temperature is lowered to a temperature of about 800° C. to about 850° C. so that an undoped $In_{0.15}Ga_{0.85}N$ active layer 5 is grown on the undoped $Al_{0.1}Ga_{0.9}N$ cladding layer 4 so as to have a thickness of about 3 nm to about 8 nm. Thereafter, the substrate temperature is raised to about 1050° C. so that a Mg-doped $Al_{0.1}Ga_{0.9}N$ cladding layer 6 is grown on the undoped $In_{0.15}Ga_{0.85}N$ active layer 5 so as to have a thickness of about 0.1 μm to about 0.3 μm. Subsequently, a Mg-doped GaN contact layer 7 is grown thereon so as to have a thickness of about 0.5 μm to about 1 μm (see FIG. 4C).

Among the undoped GaN layer 31 and the undoped $Al_{0.1}Ga_{0.9}N$ cladding layer 4 (collectively referred to as "the undoped gallium nitride type compound semiconductor layers 3' and 4, or referred to simply as " the undoped layers 3' and 4) formed above the AlN buffer layer 2, the carrier concentration of a region 10b formed above the thin buffer layer region 2b becomes about $5\times10^{17}$ $cm^{-3}$, while the carrier concentration of regions 10a formed above the thick buffer layer regions 2a becomes about $2 \times 10^{16}$ cm$^{-3}$. As a result, the high resistance regions 10a and the low resistance region 10b are formed in the undoped layers 3' and 4, thereby causing an injected current to flow through the low resistance region 10b. Thus, the low resistance region 10b is positioned below a light-emitting region of the active layer 5, and the high resistance regions 10a are positioned below non-light-emitting regions of the active layer 5, thereby forming a current constricting structure.

The phenomenon in which carrier concentration (i.e., resistivity) of the undoped gallium nitride type compound semiconductor layers 3' and 4 formed above the buffer layer 2 varies depending on a thickness of the buffer layer 2 was first noticed from the study made by the inventors of the present invention in the course of attaining the present invention. This phenomenon will be described in detail later.

Figure 4D:
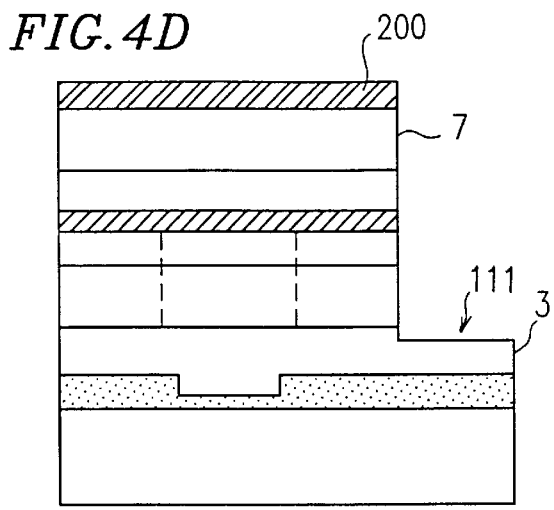

Then, the resultant wafer is taken out from the growth chamber. Next, as shown in FIG. 4D, a resist mask 200 is formed on the P-type GaN contact layer 7. Thereafter, etching is performed until a surface 111 which is a part of the N-type GaN layer 3 is exposed. Next, the resist mask 200 is removed and the wafer is heat-treated at a temperature of about 800° C. in an N$_2$ atmosphere for about 20 minutes, thereby converting the Mg-doped layer to a P-type layer.

Figure 4E:
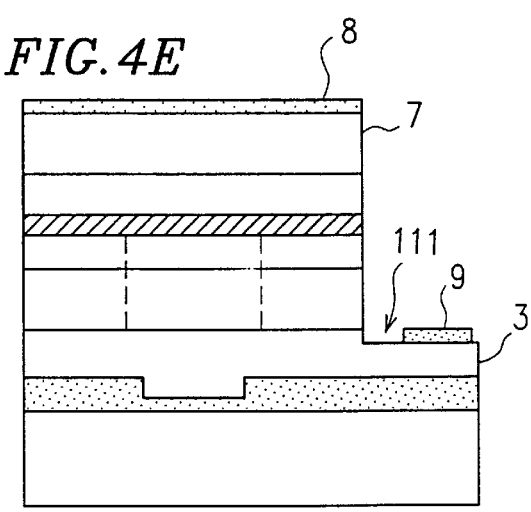

Next, as shown in FIG. 4E, an N-side electrode 9 is formed on the exposed surface 111 of the N-type GaN layer 3 which is formed by the etching, and a P-side electrode 8 is formed on the surface of the P-type GaN contact layer 7.

By performing the above-described fabrication process, the gallium nitride type compound semiconductor laser 1000 with the device structure shown in FIG. 3 is completed.

Figure 5:
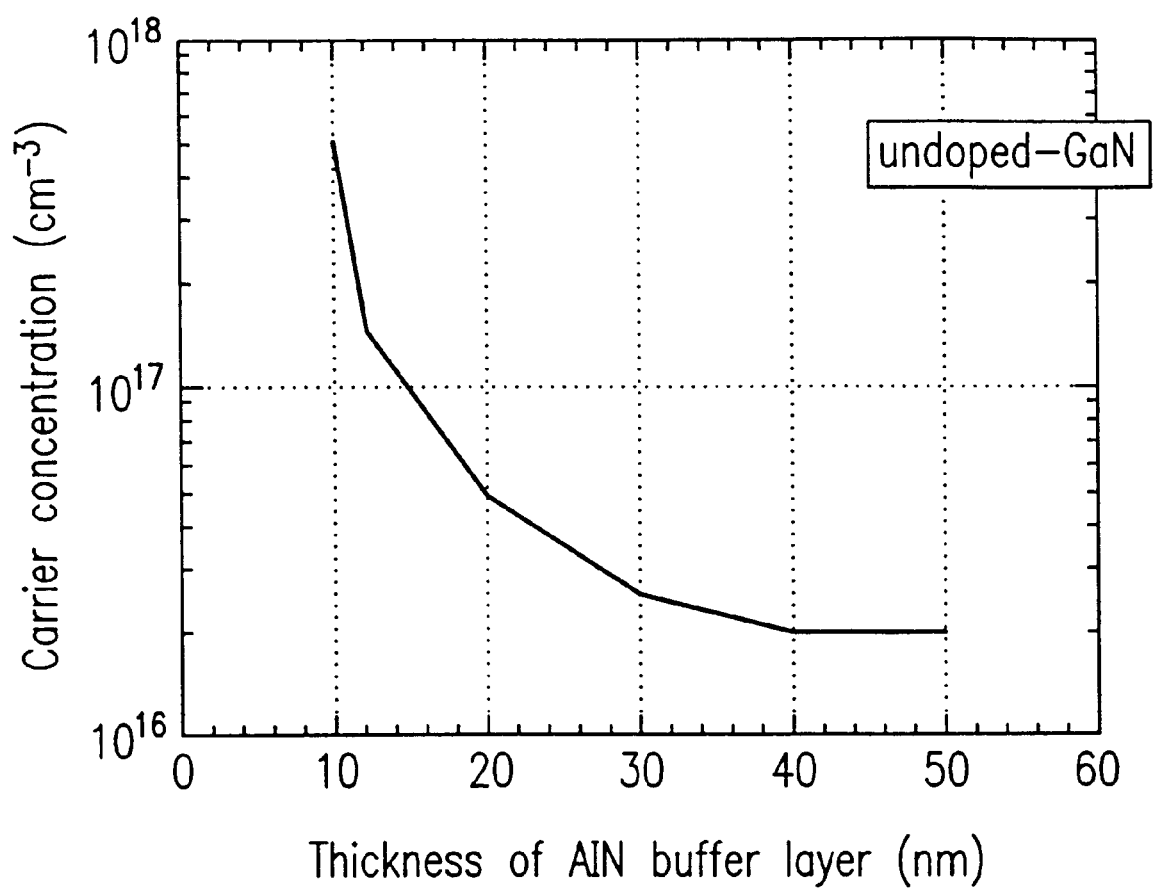
FIG. 5 is a graph showing a relationship between a thickness of a buffer layer and a carrier concentration of undoped gallium nitride type compound semiconductor layers formed on the buffer layer.

As described above, the inventors of the present invention found out that a carrier concentration of the gallium nitride type compound semiconductor layers 3' and 4 (as one example, the carrier concentration of the undoped gallium nitride type compound semiconductor layers) in the gallium nitride type compound semiconductor light-emitting device depends on a thickness of the underlying buffer layer 2. FIG. 5 is a graph showing such a relationship. When a thickness (nm) of the AlN buffer layer 2 on the horizontal axis is increased, a carrier concentration (cm$^{-3}$) of the undoped gallium nitride type compound semiconductor layers 3' and 4 on the vertical axis is reduced. Conversely, when a thickness of the AlN buffer layer 2 is reduced, a carrier concentration of the undoped layers 3' and 4 is increased.

Therefore, as in the aforementioned semiconductor laser 1000 of this embodiment, if the buffer layer 2 is etched so as to have the thick buffer layer regions 2a and the thin buffer layer region 2b, and the undoped gallium nitride type compound semiconductor layers 3' and 4 are formed thereon; the undoped gallium nitride type compound semiconductor layers 3' and 4 have the high resistance regions 10a on the thick buffer layer regions 2a and the low resistance region 10b on the thin buffer layer region 2b. As a result, it becomes possible to allow a part of the undoped gallium nitride type compound semiconductor layers 3' and 4 to serve as a current blocking region, thereby realizing a current constricting type gallium nitride tape compound semiconductor light-emitting device.

The variation in resistivity (i.e., carrier concentration) of the undoped layers 3' and 4, which depends on a thickness of the buffer layer 2 as shown in the graph of FIG. 5, is observed when a thickness of the undoped gallium nitride type compound semiconductor layers 3' and 4 formed on the buffer layer 2 is in the range of about 10 nm to about 60 nm.

In the semiconductor laser 1000 of the present embodiment as described above, it was observed that the operating voltage thereof was in the range of about 3V to about 4V and the oscillation starting current thereof was in the range of about 60 mA to about 70 mA. These values are about ½ of those in the conventional semiconductor laser 800 of a current constricting type shown in FIG. 1. In addition, the operating voltage and oscillation starting current of the semiconductor laser 1000 of this embodiment are significantly lower than those in the conventional striped electrode type semiconductor laser 900 shown in FIG. 2.

The reasons why the oscillation starting current of this embodiment is lower than those in the conventional examples are as follows.

Figure 1:
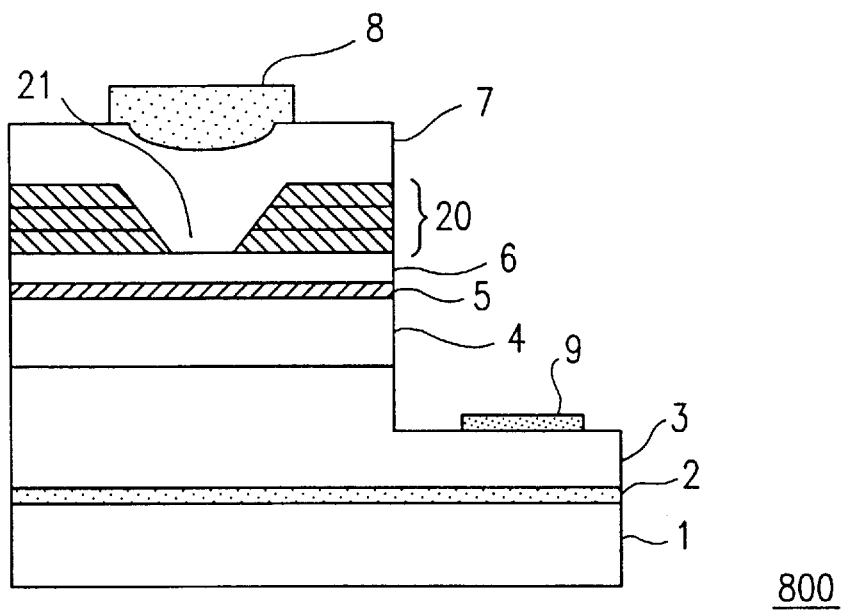
FIG. 1 is a cross-sectional view schematically illustrating the structure of a conventional gallium nitride type compound semiconductor light-emitting device (semiconductor laser) of a current constricting type.

The conventional semiconductor laser 800 shown in FIG. 1 has the regrowth interface with a high resistance on the current path. Thus, the driving voltage is increased and the oscillation starting current is thereby increased. According to the semiconductor laser 1000 of the present embodiment, on the other hand, the regrowth interface exists on the buffer layer 2 which is not on the current path. As a result, the presence of the regrowth layer causes no adverse influence on the driving voltage. Consequently, the driving voltage is kept low, thereby significantly reducing the oscillation starting current.

Figure 2:
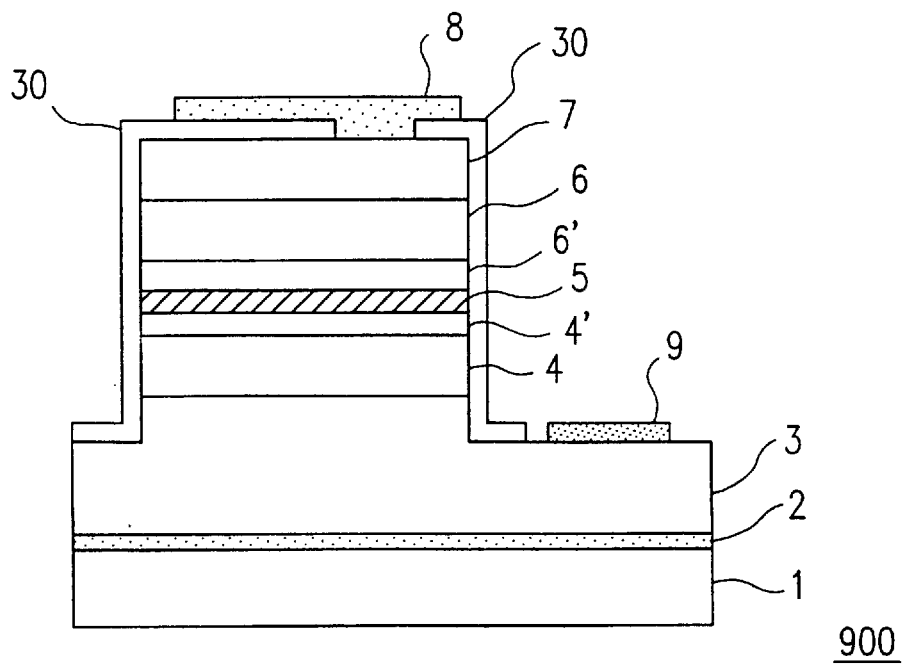
FIG. 2 is a cross-sectional view schematically illustrating the structure of a conventional gallium nitride type compound semiconductor light-emitting device (semiconductor laser) of a striped electrode type.

On the other hand, the conventional striped electrode type semiconductor laser 900 shown in FIG. 2 has a large amount of unavailable current since current flows in a spreading manner due to its device structure. As a result, it is difficult to realize a reduction in the oscillation starting current. According to the semiconductor laser 1000 of this embodiment, however, the resultant light-emitting device is of the internal current constricting type, and therefore has less unavailable current. Thus, the oscillation starting current can be significantly reduced.

The reasons why low grade crystallinity of the regrowth interface does not deteriorate electrical characteristics of the light-emitting device in the device structure of the semiconductor laser 1000 will be described more specifically hereinafter.

According to the conventional device structure as shown in FIG. 1, the regrowth interface is present in the region to be a current path, i.e., the groove 21 in the current constricting layers 20. An impurity (e.g., C, O$_2$, or the like) is generally attached on the regrowth interface, and resistance is therefore high in the vicinity of the interface. Thus, current has difficulty in flowing through the vicinity of the regrowth interface. As a result, the driving voltage becomes extremely high. The impurity attachment on the regrowth interface occurs when the wafer is taken out from the crystal growth apparatus and the groove 21 is formed by the ordinary photolithography technique or etching step while the wafer is exposed to the atmosphere.

According to Embodiment 1 of the present invention, on the other hand, the regrowth interface is present on the buffer layer 2 which is not on the current path. Therefore, even if an impurity exists on the regrowth interface, electrical characteristics are not deteriorated since no current flows through the vicinity of the regrowth interface. As a result, the oscillation starting current or the driving voltage is kept low.

As described above, according to the device structure of the semiconductor light-emitting device (the semiconductor laser) 1000 of Embodiment 1 of this invention, the current constricting structure is formed without requiring the formation of the insulating layer or the regrowth step as required in the conventional example, and adverse effect on the electrical characteristics accompanied by the regrowth process does not occur. As a result, a highly reliable light-emitting device such as a gallium nitride type compound semiconductor laser of a current constricting type can be easily fabricated.

(Embodiment 2)

Figure 6:
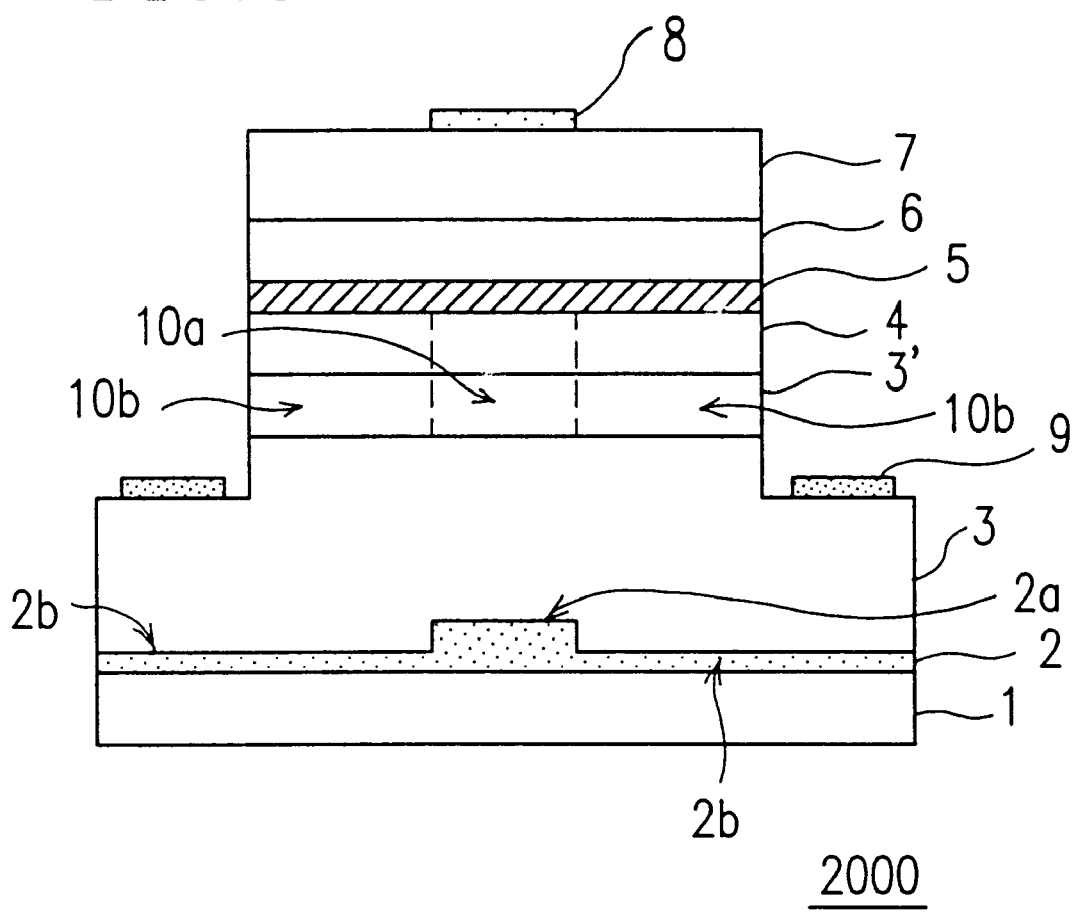
FIG. 6 is a cross-sectional view schematically illustrating the structure of a gallium nitride type compound semiconductor light-emitting device of a current blocking type according to Embodiment 2 of the present invention.

FIG. 6 is a cross-sectional view schematically illustrating the structure of a gallium nitride type compound semiconductor light-emitting device 2000 of a current blocking type as a semiconductor light-emitting device according to Embodiment 2 of the present invention. FIGS. 7A to 7E are cross-sectional views sequentially showing fabrication steps of the semiconductor light-emitting device 2000. Unlike the semiconductor laser 1000 according to Embodiment 1 of this invention, the semiconductor light-emitting device 2000 of this embodiment has a thick region 2a provided at the center portion of a buffer layer 2 and thin regions 2b provided so as to interpose the thick region 2a therebetween.

Hereinafter, the structure of the semiconductor light-emitting device 2000 and the fabrication process thereof will be described.

First, a sapphire substrate 1 is introduced onto a susceptor (not shown) of a MOCVD apparatus. While raising the temperature of the substrate 1 to about 1200° C., the sapphire substrate 1 is exposed to an $N_2$ or $H_2$ atmosphere. Next, the temperature of the sapphire substrate 1 is lowered to a temperature of about 400° C. to about 650° C. Thereafter, as shown in FIG. 7A, the buffer layer 2 (an AlN buffer layer 2 in this embodiment) generally made of $Al_xGa_{1-x}N$ ($0 \leq x \leq 1$) is grown on the sapphire substrate 1 so as to have a thickness of about 50 nm.

Next, the resultant wafer is taken out from the MOCVD apparatus. As shown in FIG. 7B, a resist mask 100 having a predetermined pattern is formed on the AlN buffer layer 2 using an ordinary photolithography technique, and using the resist mask 100, the AlN buffer layer 2 is etched so as to form the thick buffer layer region 2a and the thin buffer layer regions 2b. More specifically, as shown in FIG. 7B, the thick buffer layer region 2a is formed at the center portion of the buffer layer 2, and the thin buffer layer regions 2b are formed at both sides of the thick buffer layer region 2a.

Next, after removing the resist mask 100, the wafer is re-introduced onto the susceptor of the MOCVD apparatus. The substrate temperature is raised to about 1050° C., thereby growing a Si-doped N-type GaN layer 3 with a thickness of about 0.5 μm to about 2 μm on the AlN buffer layer 2. Subsequently, an undoped GaN layer 3' is grown thereon so as to have a thickness of about 2 μm. Thereafter, an undoped $Al_{0.1}Ga_{0.9}N$ cladding layer 4 is grown thereon so as to have a thickness of about 0.1 μm to about 0.3 μm.

Next, the substrate temperature is lowered to a temperature of about 800° C. to about 850° C. so that an undoped $In_{0.15}Ga_{0.85}N$ active layer 5 is grown on the undoped $Al_{0.1}Ga_{0.9}N$ cladding layer 4 so as to have a thickness of about 3 nm to about 8 nm. Thereafter, the substrate temperature is raised to about 1050° C. so that a Mg-doped $Al_{0.1}Ga_{0.9}N$ cladding layer 6 is grown on the undoped $In_{0.15}Ga_{0.85}N$ active layer 5 so as to have a thickness of about 0.1 μm to about 0.3 μm. A Mg-doped GaN contact layer 7 is grown thereon so as to have a thickness of about 0.5 μm to about 1 μm (see FIG. 7C).

Among the undoped GaN layer 3' and the undoped $Al_{0.1}Ga_{0.9}N$ cladding layer 4 (i.e., the undoped gallium nitride type compound semiconductor layers 3' and 4) formed above the AlN buffer layer 2, the carrier concentration of regions 10b formed above the thin buffer layer regions 2b becomes about $5 \times 10^{17}$ cm$^{-3}$, while the carrier concentration of a region 10a formed above the thick buffer layer region 2a becomes about $2 \times 10^{16}$ cm$^{-3}$. As a result, the high resistance region 10a and the low resistance regions 10b are formed in the undoped layers 3' and 4, thereby causing an injected current to flow through the low resistance regions 10b. Thus, the low resistance regions 10b are positioned below light-emitting regions of the active layer 5 and the high resistance region 10a is positioned below a non-light-emitting region of the active layer 5, thereby forming a current blocking type structure.

Then, the resultant wafer is taken out from the growth chamber. Next, as shown in FIG. 7D, a resist mask 200 is formed on the P-type GaN contact layer 7. Thereafter, etching is performed until surfaces 111 which are parts of the N-type GaN contact layer 3 are exposed. Next, the resist mask 200 is removed and the wafer is heat-treated at a temperature of about 800° C. in an $N_2$ atmosphere for about 20 minutes, thereby converting the Mg-doped layer to a P-type layer.

Next, as shown in FIG. 7E, N-side electrodes 9 are formed on the exposed surfaces 111 of the N-type GaN layer 3 which are formed by the etching, and a P-side electrode 8 is formed on the surface of the P-type GaN contact layer 7. Since the low resistance regions 10b are formed so as to interpose the high resistance region 10a according to the present embodiment, the exposed surfaces 111 are formed at both sides of the N-type GaN layer 3 so as to correspond to the low resistance regions 10b, respectively, as shown in FIG. 7E, and the N-side electrodes 9 are formed on the exposed surfaces 111, respectively.

By performing the above-described fabrication process, the gallium nitride type compound semiconductor light-emitting device 2000 with the device structure shown in FIG. 6 is completed.

Brightness of the gallium nitride type compound semiconductor light-emitting device 2000 of a current blocking type having the above-described device structure according to Embodiment 2 of the present invention is about twice as much as that of the conventional gallium nitride type compound semiconductor light-emitting device. The reason will be described hereinafter.

According to Embodiment 2 of the present invention, the high resistance region 10a is provided so that no current is injected into a part of the undoped $In_{0.15}Ga_{0.85}N$ active layer 5 (light-emitting layer) positioned directly below the P-side electrode 8 to reduce the unavailable current. Therefore, current does not flow into the region directly below the electrode from which the generated light cannot be taken out due to the presence of the P-side electrode 8. Accordingly, current is efficiently injected into the light-emitting layer (i.e., the active layer) 5, and thus, the light emission efficiency is improved. Therefore, brightness is significantly increased as described above.

(Embodiment 3)

Figure 8:
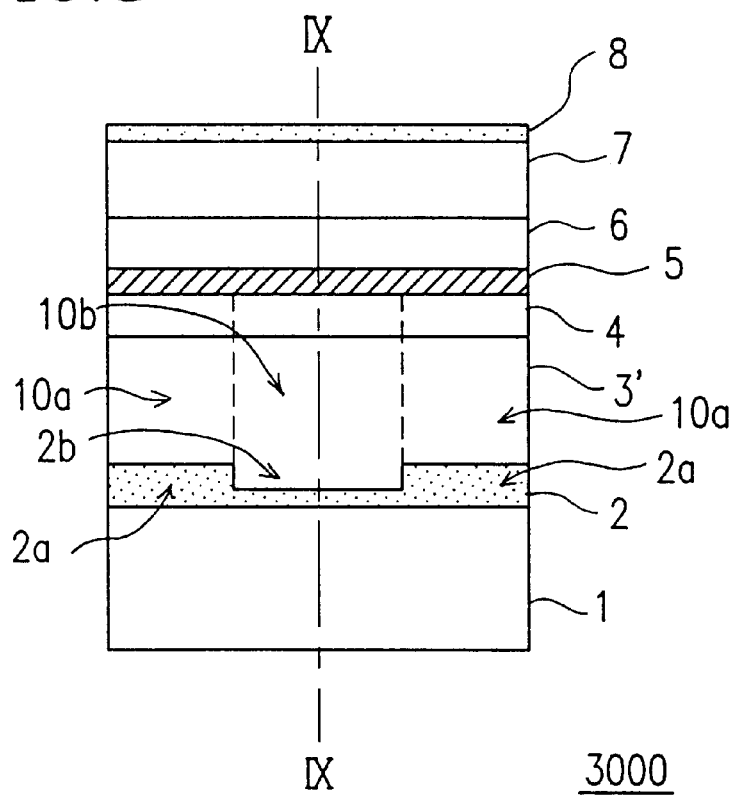
FIG. 8 is a cross-sectional view schematically illustrating the structure of a gallium nitride type compound semiconductor light-emitting device (semiconductor laser) of a current constricting type according to Embodiment 3 of the present invention.
Figure 9:
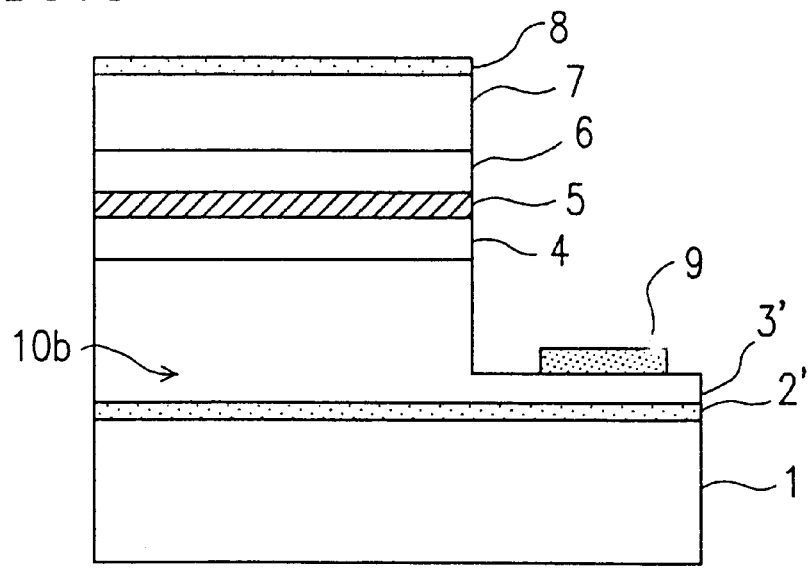
FIG. 9 is a cross-sectional view of the semiconductor light-emitting device (semiconductor laser) taken along line IX—IX in FIG. 8.

FIG. 8 is a cross-sectional view schematically illustrating the structure of a gallium nitride type compound semiconductor laser 3000 of a current constricting type as a semiconductor light-emitting device according to Embodiment 3 of the present invention. FIG. 9 is a cross-sectional view of the compound semiconductor laser 3000 taken along line IX—IX in FIG. 8. FIG. 9 particularly illustrates an electrode arrangement thereof.

According to the semiconductor laser 3000, an undoped GaN layer 3' is directly formed on a buffer layer 2 without providing the N-type GaN layer 3 interposed therebetween. In the same manner as in Embodiments 1 and 2, by providing thick regions 2a and a thin region 2b in the buffer layer 2, high resistance regions 10a and a low resistance region 10b are formed in the undoped GaN layer 3' (and a layer 4 formed thereon). As shown in FIG. 9, an N-side electrode 9 is formed on the low resistance region 10b of the undoped GaN layer 3'.

The other structure of the semiconductor laser 3000 is basically the same as that of the semiconductor laser 1000 or the semiconductor light-emitting device 2000 described in Embodiments 1 and 2, respectively. The corresponding components are denoted by the same reference numerals, and the description thereof is herein omitted.

According to Embodiment 3 of the present invention, it is possible to realize the gallium nitride type compound semiconductor laser (light-emitting device) 3000 of a current constricting type which does not require the N-type GaN layer 3 as formed in the device of Embodiment 1 or Embodiment 2. Therefore, in addition to the effects obtained in the devices of Embodiment 1 and 2, there are advantages of simplified fabrication process and reduced cost.

(Embodiment 4)

Figure 10:
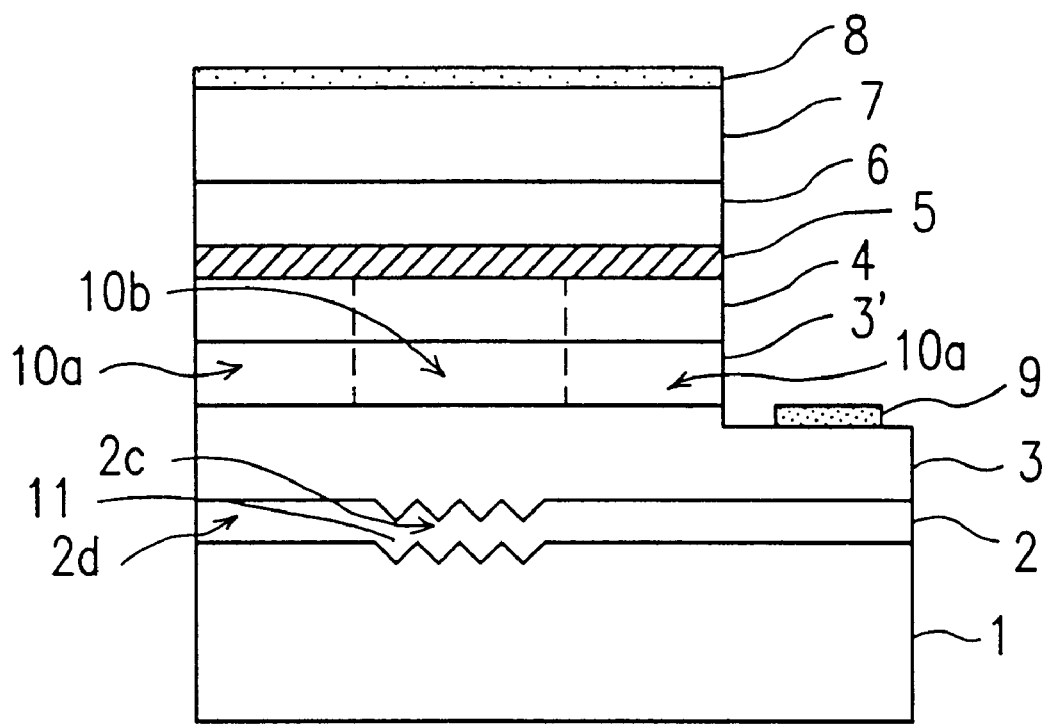
FIG. 10 is a cross-sectional view schematically illustrating the structure of a gallium nitride type compound semiconductor light-emitting device (semiconductor laser) of a current constricting type according to Embodiment 4 of the present invention.

FIG. 10 is a cross-sectional view schematically illustrating the structure of a gallium nitride type compound semiconductor laser 4000 of a current constricting type as a semiconductor light-emitting device according to Embodiment 4 of the present invention. FIGS. 11A to 11E are cross-sectional views sequentially showing fabrication steps of the semiconductor laser 4000.

Hereinafter, the structure of the semiconductor laser 4000 and the fabrication process thereof will be described.

Figure 11A:
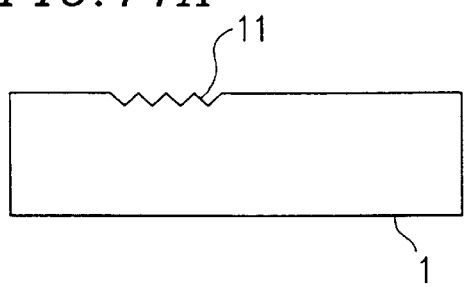
FIGS. 11A to 11E are cross-sectional views for schematically describing each of fabrication steps for forming the semiconductor light-emitting device (semiconductor laser) shown in FIG. 10.

First, as shown in FIG. 11A, a plurality of striped V-shaped grooves 11 are formed in a predetermined region (hereinafter, referred to also as a "processed region") with a width of about 1 $\mu$m to about 3 $\mu$m on the surface of a sapphire substrate 1. A depth of each V-shaped groove 11 is in the range of about 10 Å to about 1000 Å and preferably about 500 Å. A width of each V-shaped groove 11 is in the range of about 50 Å to about 1000 Å and preferably about 400 Å. A distance between the maximum depth points of the two adjacent V-shaped grooves 11 is preferably about 1000 Å.

As an etching treatment for forming the V-shaped groove 11, a dry etching method (e.g., a reactive ion etching (RIE) method or a reactive ion beam etching (RIBE) method) is preferably used. In the case where $Cl_2$ gas is used as an etching gas for the dry etching, a $SiO_2$ mask may be used as a etching mask (not shown). The etching rate of the sapphire substrate 1 is about 190 Å/min.

Figure 11B:
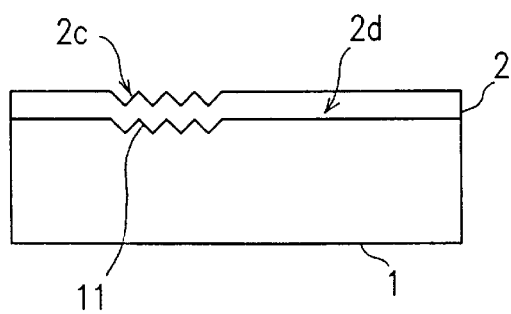
Figure 11C:
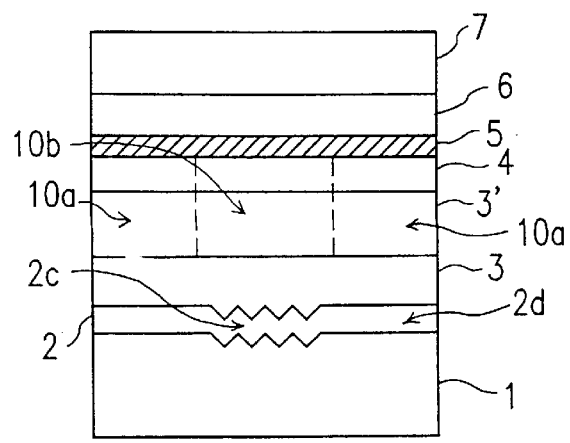

After forming the above-described V-shaped grooves 11, the sapphire substrate 1 is introduced onto a susceptor (not shown) of a MOCVD apparatus. While raising the temperature of the substrate 1 to about 1200° C., the sapphire substrate 1 is exposed to an $N_2$ or $H_2$ atmosphere. Next, the temperature of the sapphire substrate 1 is lowered to a temperature of about 400° C. to about 650° C. Thereafter, as shown in FIG. 11B, a buffer layer 2 (an AlN buffer layer 2 in this embodiment) generally made of $Al_xGa_{1-x}N$ ($0 \leq x \leq 1$) is grown on the sapphire substrate 1 so as to have a thickness of about 50 nm. During this step, the buffer layer 2 is formed so as to have a corrugated pattern in a region 2c positioned above the pattern of the V-shaped grooves 11 provided on the surface of the underlaying sapphire substrate 1 (i.e., on the processed region of the sapphire substrate 1) and a flat surface in a region 2d excluding the region 2c.

Then, the substrate temperature is raised to about 1050° C., thereby growing a Si-doped N-type GaN layer 3 with a thickness of about 0.5 $\mu$m to about 2 $\mu$m on the AlN buffer layer 2. Subsequently, an undoped GaN layer 3' is grown thereon so as to have a thickness of about 2 $\mu$m. Thereafter, an undoped $Al_{0.1}Ga_{0.9}N$ cladding layer 4 is grown thereon so as to have a thickness of about 0.1 $\mu$m to about 0.3 $\mu$m.

Next, the substrate temperature is lowered to a temperature of about 800° C. to about 850° C. so that an undoped $In_{0.15}Ga_{0.85}N$ active layer 5 is grown on the undoped $Al_{0.1}Ga_{0.9}N$ cladding layer 4 so as to have a thickness of about 3 nm to about 80 nm. Thereafter, the substrate temperature is raised to about 1050° C. so that a Mg-doped $Al_{0.1}Ga_{0.9}N$ cladding layer 6 is grown on the undoped $In_{0.15}Ga_{0.85}N$ active layer 5 so as to have a thickness of about 0.1 $\mu$m to about 0.3 $\mu$m. Subsequently, a Mg-doped GaN contact layer 7 is grown thereon so as to have a thickness of about 0.5 $\mu$m to about 1 $\mu$m (see FIG. 11C).

Among the undoped GaN layer 3' and the undoped $Al_{0.1}Ga_{0.9}N$ cladding layer 4 (i.e., the undoped gallium nitride type compound semiconductor layers 3' and 4) formed above the AlN buffer layer 2, the carrier concentration of a region 10b formed above the region 2c with the corrugated pattern, positioned on the processed region of the sapphire substrate 1 (i.e., on the pattern of the V-shaped grooves 11), becomes about $5 \times 10^{17}$ cm$^{-3}$, while the carrier concentration of regions 10a formed above the region 2d covering an area other than the region 2c becomes about $2 \times 10^{16}$ cm$^{-3}$. Thus, the high resistance regions 10a and the low resistance region 10b are formed in the undoped gallium nitride type compound semiconductor layers 3' and 4, thereby causing an injected current to flow through the low resistance region 10b. As a result, the low resistance region 10b is positioned below the light-emitting region of the active layer 5 and the high resistance regions 10a are positioned below the non-light-emitting regions of the active layer 5, thereby forming a current constricting structure.

The phenomenon in which carrier concentration (i.e., resistivity) of the undoped gallium nitride type compound semiconductor layers 3' and 4 formed above the buffer layer 2 varies depending on whether the buffer layer 2 has the corrugated pattern corresponding to the position of the processed region in the underlying substrate 1 (i.e., whether the surface of the substrate 1 has the pattern of the V-shaped grooves 11) was first noticed from the study made by the inventors of the present invention in the course of attaining the present invention. This phenomenon will be described in detail later.

Figure 11D:
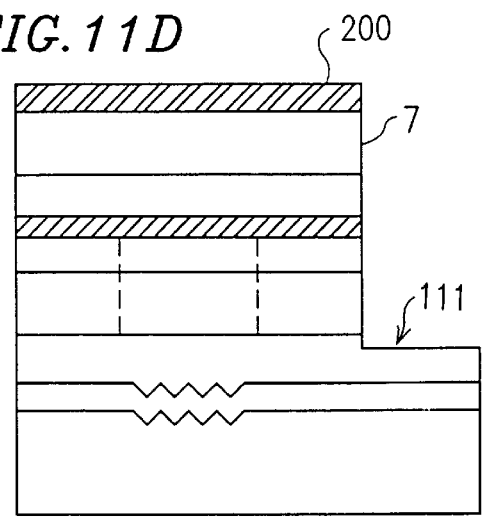

Then, the resultant wafer is taken out from the growth chamber. Next, as shown in FIG. 11D, a resist mask 200 is formed on the P-type GaN contact layer 7. Thereafter, etching is performed until a surface 111 which is a part of the N-type GaN layer 3 is exposed. Next, the resist mask 200 is removed and the wafer is heat-treated at a temperature of about 800° C. in an $N_2$ atmosphere for about 20 minutes, thereby converting the Mg-doped layer to a P-type layer.

Figure 11E:
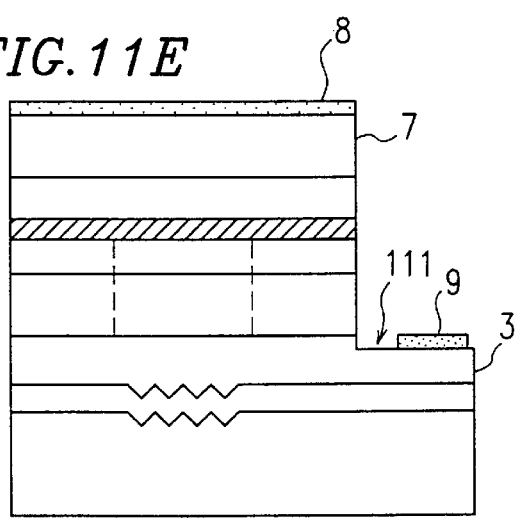

Next, as shown in FIG. 11E, an N-side electrode 9 is formed on the exposed surface 111 of the N-type GaN layer 3 which is formed by the etching, and a P-side electrode 8 is formed on the surface of the P-type GaN contact layer 7.

By performing the above-described fabrication process, the gallium nitride type compound semiconductor laser 4000 with the device structure shown in FIG. 10 is completed.

As described above, the inventors of the present invention noticed that upon forming the undoped gallium nitride type compound semiconductor layers 3' and 4 (e.g., GaN layers) on the underlying substrate 1 (e.g., a sapphire substrate) with the buffer layer 2 interposed therebetween in the gallium nitride type compound semiconductor light-emitting device, the carrier concentration of the undoped layers 3' and 4 varies between the case where the surface of the underlying substrate 1 is processed so as to have a pattern such as the V-shaped groove 11 and the case where the surface of the underlying substrate 1 does not have such a pattern. More specifically, the surface of the underlying substrate 1 is processed so as to form a pattern such as the V-shaped groove 11; the buffer layer 2 is formed so as to cover the processed substrate surface (i.e., processed region) and the non-processed substrate surface (i.e., non-processed region); and the undoped gallium nitride type compound semiconductor layers 3' and 4 are formed above the buffer layer 2. Thus, the undoped layers 3' and 4 have a lower resistivity in the region above the processed region of the substrate 1 as compared to the resistivity in the region above the non-processed region of the substrate 1.

By utilizing the above-described phenomenon, the high resistance regions 10a in the undoped layers 3' and 4 function as current blocking regions, thereby causing current to flow through the low resistance region 10b in the undoped layers 3' and 4. As a result, without performing the step of forming the insulating layer or the regrowth step required in the conventional example, it becomes possible to realize the current constricting structure in which part of the undoped layers 3' and 4 serves as a current blocking region.

In the case where the semiconductor light-emitting device has a layered structure including at least a first conductivity type cladding layer, an active layer, and a second conductivity type cladding layer formed in this order on the underlying substrate, the undoped gallium nitride type compound semiconductor layer serving as a current constricting layer is to be provided below the active layer (i.e., closer to the substrate 1). More specifically, the undoped gallium nitride type compound semiconductor layer may be on or under the first conductivity type cladding layer.

In the case where the first conductivity type is of the N type, however, it is preferable that the first conductivity type cladding layer, the undoped gallium nitride type compound semiconductor layer, the undoped cladding layer, and the active layer are formed on the substrate in this order. In such a case, regions having respectively different resistivities reflecting the surface shapes of the underlying substrate (i.e., whether the process treatment is performed or not) are formed also in the undoped cladding layer. Therefore, the undoped cladding layer also functions as a current constricting layer. As a result, combined current constricting effect can be obtained.

Alternatively, in the case where the semiconductor light-emitting device has a layered structure at least including the undoped cladding layer, the active layer, and the P-type cladding layer formed on the underlying substrate in this order, the undoped gallium nitride type compound semiconductor layer serving as a current constricting layer is to be provided below the active layer (i.e., closer to the substrate 1). More specifically, the undoped gallium nitride type compound semiconductor layer may be on or under the undoped cladding layer. In such a case, regions having respectively different resistivities reflecting the surface shapes of the underlying substrate (i.e., whether the process treatment is performed or not) are formed also in the undoped cladding layer. Therefore, the undoped cladding layer also functions as a current constricting layer. As a result, combined current constricting effect can be obtained.

Figure 12:
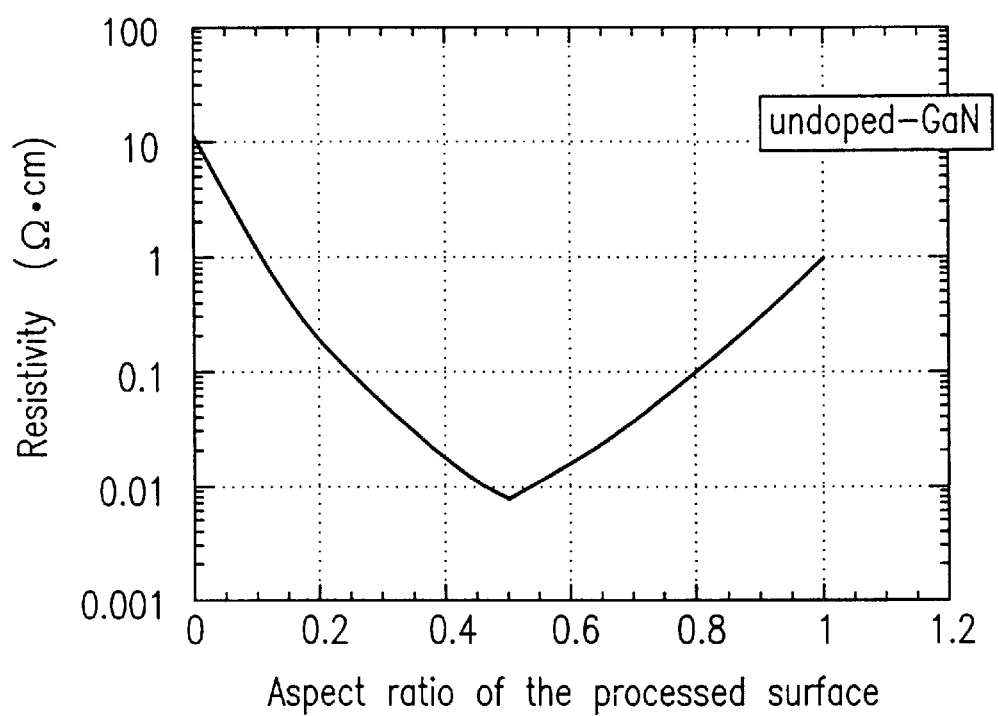
FIG. 12 is a graph showing a relationship between an aspect ratio of a processed region of an underlying substrate and a carrier concentration of undoped gallium nitride type compound semiconductor layers formed on the processed region.

FIG. 12 is a graph showing a relationship between the processed shape of the underlying substrate (i.e., the sapphire substrate) and the resistivity of the undoped gallium nitride type compound semiconductor layers (i.e., the undoped GaN layer) formed on the underlying substrate via the buffer layer (i.e, the AlN layer). More specifically, the horizontal axis in FIG. 12 shows a ratio (i.e., an aspect ratio) of the depth and width of each V-shaped groove formed on the surface of the sapphire substrate, and the vertical axis thereof shows a resistivity of the undoped GaN layer formed on the processed surface via the AlN buffer layer. A point on the horizontal axis where the aspect ratio is 0 represents the case where the surface of the substrate 1 is not processed.

According to the graph, when the aspect ratio is 0.5 where the equivalent thickness of the overlying AlN buffer layer is the smallest, the resistivity of the undoped GaN layer formed thereon takes the smallest value. When the aspect ratio is greater than 0.5, the resistivity of the undoped GaN layer formed on the AlN buffer layer gradually increases. Moreover, in reality, it is difficult to process the shape with an aspect ratio of greater than 0.5.

In order to allow a semiconductor light-emitting device to exhibit a sufficient light-emitting function by providing the regions with resistivities sufficiently different from each other in the undoped layers so that the region serves as a current blocking region, it is preferable that there exists, in general, about two digits of resistivity difference between the current blocking region (i.e., the high resistance region) and the non-blocking region (i.e., the low resistance region). The resistivity of the non-blocking region of the undoped layers is preferably about 0.1 $\Omega$·cm or less. For example, in the relationship shown in FIG. 12, 0.008 $\Omega$·cm which is the resistivity obtained when the aspect ratio is 0.5 is the most preferable. In consideration of the above-described points, in order to obtain the sufficient current constricting (or blocking) function, the aspect ratio of the processed region to be provided in a part of the underlying substrate is set to be preferably in the range of about 0.25 to about 0.5, and more preferably set to be 0.5.

The processing of the surface of the underlying substrate is not limited to the pattern formation of the V-shaped groove 11 described above. For example, such processing may be the formation of an U-shaped groove pattern or the formation of a concave groove pattern, as described in the subsequent embodiments.

According to the semiconductor laser 4000 of this embodiment as described above, it was observed that its operating voltage was in the range of about 3 V to about 4 V, and its oscillation starting current was in the range of about 60 mA to about 70 mA. These values are about ½ of the values obtained in the conventional current constricting type semiconductor laser 800 shown in FIG. 1. The reasons for the above improvements are the same as that described in relation to Embodiment 1 of the present invention.

As described above, according to the aforementioned semiconductor laser 4000 of this embodiment, after processing a part of the surface of the underlying substrate 1, the undoped gallium nitride type compound semiconductor layers 3' and 4 are formed on both of the processed region and the non-processed region via the buffer layer 2. The undoped gallium nitride type compound semiconductor layers 3' and 4 have the high resistance regions 10a above the non-processed regions of the substrate 1 and the low resistance region 10b above the processed region. As a result, it becomes possible to allow part of the undoped gallium nitride type compound semiconductor layers 3' and 4 to function as a current blocking region, thereby realizing the gallium nitride type compound semiconductor light-emitting device of a current constricting type.

The reason why the resistivity of the undoped gallium nitride type compound semiconductor layers 3' and 4 above the processed region of the underlying substrate 1 becomes greater than that of the layers 3' and 4 above the non-processed region of the underlying substrate 1 appears to be that the thickness of the buffer layer 2 on the processed region of the underlying substrate 1 becomes equivalently thinner than that of the buffer layer 2 on the non-processed region of the underlying substrate 1. This results in differences in the carrier concentration of the undoped layers 3' and 4 in accordance with the relationship described in Embodiment 1 of the present invention.

(Embodiment 5)

Figure 13:
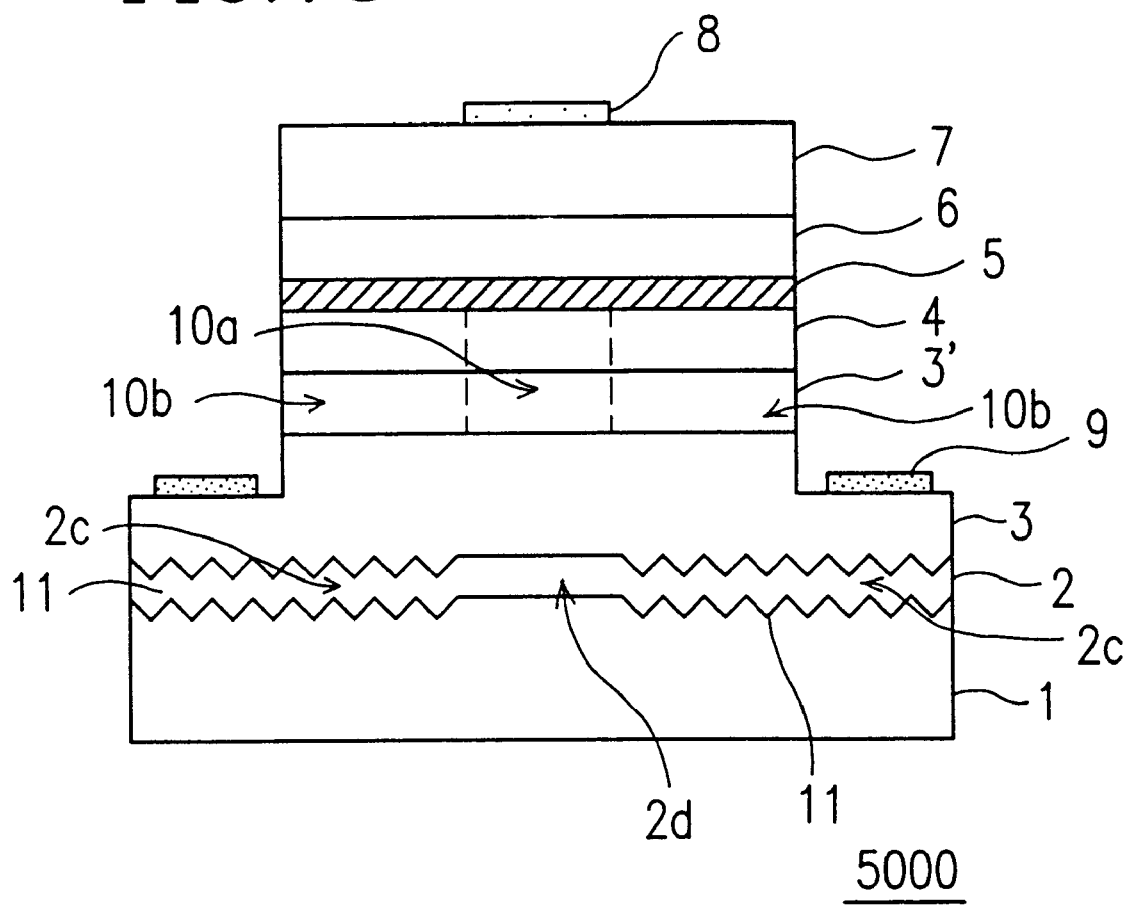
FIG. 13 is a cross-sectional view schematically illustrating the structure of a gallium nitride type compound semiconductor light-emitting device of a current blocking type according to Embodiment 5 of the present invention.

FIG. 13 is a cross-sectional view schematically illustrating the structure of a current blocking type gallium nitride type compound semiconductor light-emitting device 5000 as a semiconductor light-emitting device according to Embodiment 5 of the present invention. FIGS. 14A to 14E are cross-sectional views sequentially showing fabrication steps of the current blocking type gallium nitride type compound semiconductor light-emitting device 5000. Unlike the semiconductor laser 4000 of Embodiment 4, the semiconductor light-emitting device 5000 of this embodiment does not have a pattern of V-shaped grooves 11 at the center portion of the substrate 1.

Hereinafter, the structure of the semiconductor light-emitting device 5000 and the fabrication process thereof will be described.

Figure 14A:
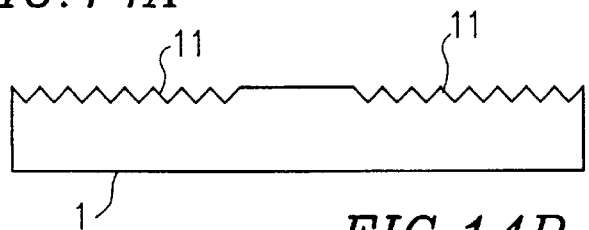
FIGS. 14A to 14E are cross-sectional views for schematically describing each of fabrication steps for forming the semiconductor light-emitting device shown in FIG. 13.

First, as shown in FIG. 14A, a plurality of the striped V-shaped grooves 11 are formed in a predetermined region (i.e., a processed region) with a width of about 1 μm to about 3 μm on the surface of the sapphire substrate 1. A depth of each V-shaped groove 11 is in the range of about 10 Å to about 1000 Å and preferably about 500 Å. A width of each V-shaped groove 11 is in the range of about 50 Å to about 1000 Å and preferably about 300 Å. A distance between the maximum depth points of the two adjacent V-shaped grooves 11 is preferably about 200 Å.

As an etching treatment for forming the V-shaped groove 11, a dry etching method (e.g., a reactive ion etching (RIE) method or a reactive ion beam etching (RIBE) method) is preferably used. In the case where $Cl_2$ gas is used as an etching gas for the dry etching, a $SiO_2$ mask may be used as an etching mask (not shown). The etching rate of the sapphire substrate 1 is about 190 Å/min.

Figure 14B:
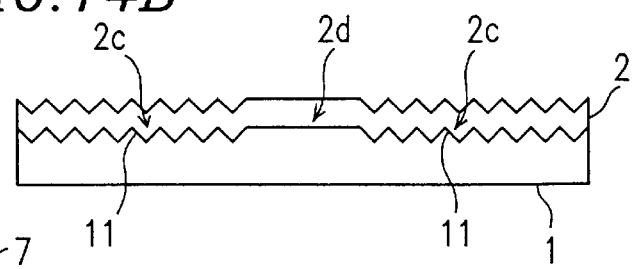
Figure 14C:
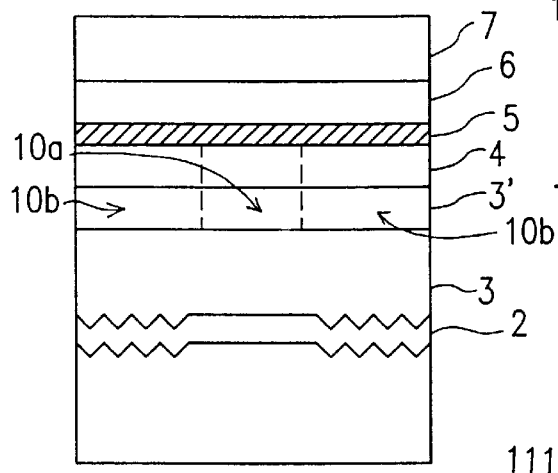

After forming the above-described V-shaped grooves 11, the sapphire substrate 1 is introduced onto a susceptor (not shown) of a MOCVD apparatus. While raising the temperature of the substrate 1 to about 1200° C., the sapphire substrate 1 is exposed to an $N_2$ or $H_2$ atmosphere. Next, the temperature of the sapphire substrate 1 is lowered to a temperature of about 400° C. to about 650° C. Thereafter, as shown in FIG. 14B, a buffer layer 2 (an AlN buffer layer 2 in this embodiment) generally made of $Al_xGa_{1-x}N$ ($0 \leq x \leq 1$) is grown on the sapphire substrate 1 so as to have a thickness of about 50 nm. During this step, the buffer layer 2 is formed so as to have corrugated patterns in regions 2c positioned above the patterns of the V-shaped grooves 11 provided on the surface of the underlaying sapphire substrate 1 (i.e., on the processed regions of the sapphire substrate 1) and a flat surface in a region 2d excluding the regions 2c.

The substrate temperature is raised to about 1050° C., thereby growing a Si-doped N-type GaN layer 3 with a thickness of about 0.5 μm to about 2 μm on the AlN buffer layer 2. Subsequently, an undoped GaN layer 3' is grown thereon so as to have a thickness of about 2 μm. Thereafter, an undoped $Al_{0.1}Ga_{0.9}N$ cladding layer 4 is grown thereon so as to have a thickness of about 0.1 μm to about 0.3 μm.

Next, the substrate temperature is lowered to a temperature of about 800° C. to about 850° C. so that an undoped $In_{0.15}Ga_{0.85}N$ active layer 5 is grown on the undoped $Al_{0.1}Ga_{0.9}N$ cladding layer 4 so as to have a thickness of about 3 nm to about 80 nm. Thereafter, the substrate temperature is raised to about 1050° C. so that a Mg-doped $Al_{0.1}Ga_{0.9}N$ cladding layer 6 is grown on the undoped $In_{0.15}Ga_{0.85}N$ active layer 5 so as to have a thickness of about 0.1 μm to about 0.3 μm. Subsequently, a Mg-doped GaN contact layer 7 is grown thereon so as to have a thickness of about 0.5 μm to about 1 μm (see FIG. 14C).

Among the undoped GaN layer 3' and the undoped $Al_{0.1}Ga_{0.9}N$ cladding layer 4 formed above the AlN buffer layer 2, the carrier concentration of regions 10b formed above the regions 2c with the corrugated patterns positioned on the processed regions of the sapphire substrate 1 (i.e., on the patterns of the V-shaped grooves 11) becomes about $5 \times 10^{17}$ cm$^{-3}$, while the carrier concentration of a region 10a formed above the region 2d covering an area other than the regions 2c becomes about $2 \times 10^{16}$ cm$^{-3}$. Thus, the high resistance region 10a and the low resistance regions 10b are formed in the undoped gallium nitride type compound semiconductor layers 3' and 4, thereby causing an injected current to flow through the low resistance regions 10b. Accordingly, the low resistance regions 10b are positioned below the light-emitting regions of the active layer 5 and the high resistance region 10a is positioned below the non-light-emitting region of the active layer 5, thereby forming a current blocking type structure.

Figure 14D:
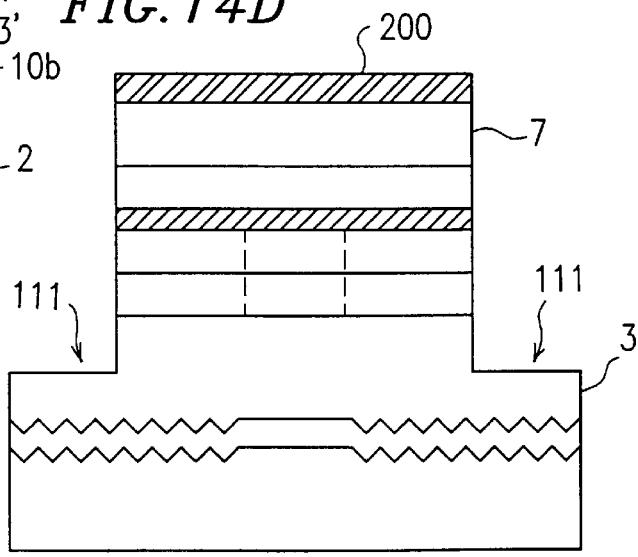

Then, the resultant wafer is taken out from the growth chamber. Next, as shown in FIG. 14D, a resist mask 200 is formed on the P-type GaN contact layer 7. Thereafter, etching is performed until surfaces 111, which are parts of the N-type GaN layer 3, are exposed. Next, the resist mask 200 is removed and the wafer is heat-treated at a temperature of about 800° C. in an $N_2$ atmosphere for about 20 minutes, thereby converting the Mg-doped layer to a P-type layer.

Figure 14E:
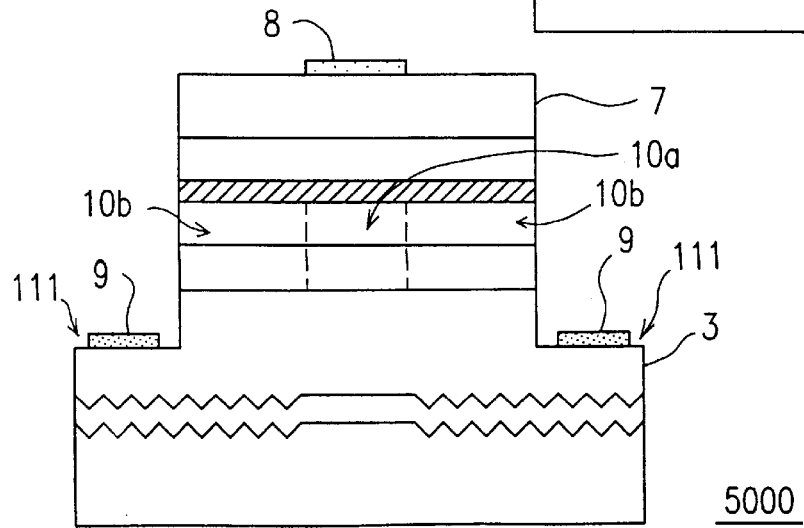

Next, as shown in FIG. 14E, 14-side electrodes 9 are formed on the exposed surfaces 111 of the N-type GaN layer 3 which are formed by the etching, and a P-side electrode 8 is formed on the surface of the P-type GaN contact layer 7. According to Embodiment 5 of the present invention, since the low resistance regions 10b are formed at the both sides of the high resistance region 10a as shown in FIG. 14E, the exposed surfaces 111 are formed at both sides of the N-type GaN layer 3 so as to correspond to the low resistance regions 10b, respectively. The N-side electrodes 9 are formed on the exposed surfaces 111, respectively.

By performing the above-described fabrication process, the gallium nitride type compound semiconductor light-emitting device 5000 with the device structure shown in FIG. 13 is completed.

Brightness of the gallium nitride type compound semiconductor light-emitting device 5000 of a current blocking type having the above-described device structure according to Embodiment 5 of the present invention is about twice as much as that of the conventional gallium nitride type compound semiconductor light-emitting device. The reason for the improved brightness is the same as that described in relation to Embodiment 2 of the present invention.

(Embodiment 6)

Figure 15:
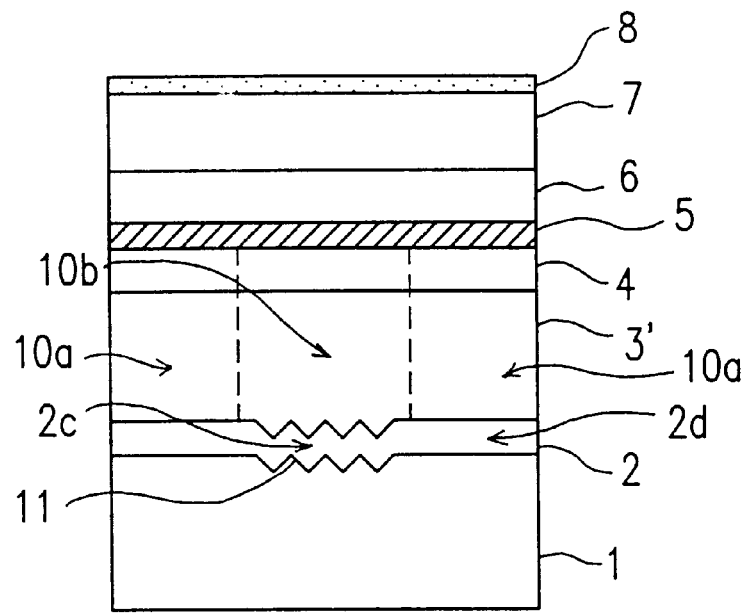
FIG. 15 is a cross-sectional view schematically illustrating the structure of a gallium nitride type compound semiconductor light-emitting device (semiconductor laser) of a current constricting type according to Embodiment 6 of the present invention.

FIG. 15 is a cross-sectional view schematically illustrating the structure of a gallium nitride type compound semiconductor laser 6000 of a current constricting type as a semiconductor light-emitting device according to Embodiment 6 of the present invention.

According to the semiconductor laser 6000, an undoped GaN layer 3' is directly formed on a buffer layer 2 without providing the N-type GaN layer 3 interposed therebetween. In the same manner as in Embodiments 4 and 5, by providing a pattern of V-shaped grooves 11 on a part of the surface of an underlying substrate 1, high resistance regions 10a and a low resistance region 10b are formed in the undoped GaN layer 3' (and a layer 4 formed thereon). An N-side electrode (not shown in FIG. 15) is formed on the low resistance region 10b of the undoped GaN layer 3' as in the structure shown in FIG. 9 in conjunction with Embodiment 3.

The other structure of the semiconductor laser 6000 is basically the same as that of the semiconductor laser 4000 or the semiconductor light-emitting device 5000 described in Embodiments 4 and 5, respectively. The corresponding components are denoted by the same reference numerals, and the description thereof is herein omitted.

According to Embodiment 6 of the present invention, it is possible to realize the gallium nitride type compound semiconductor laser (light-emitting device) 6000 of a current constricting type, which does not require the N-type GaN layer 3 as formed in the device of Embodiment 4 or Embodiment 5. Therefore, in addition to the effects obtained in the devices of Embodiments 4 and 5, there are advantages of simplified fabrication process and reduced cost.

(Embodiment 7)

Figure 16:
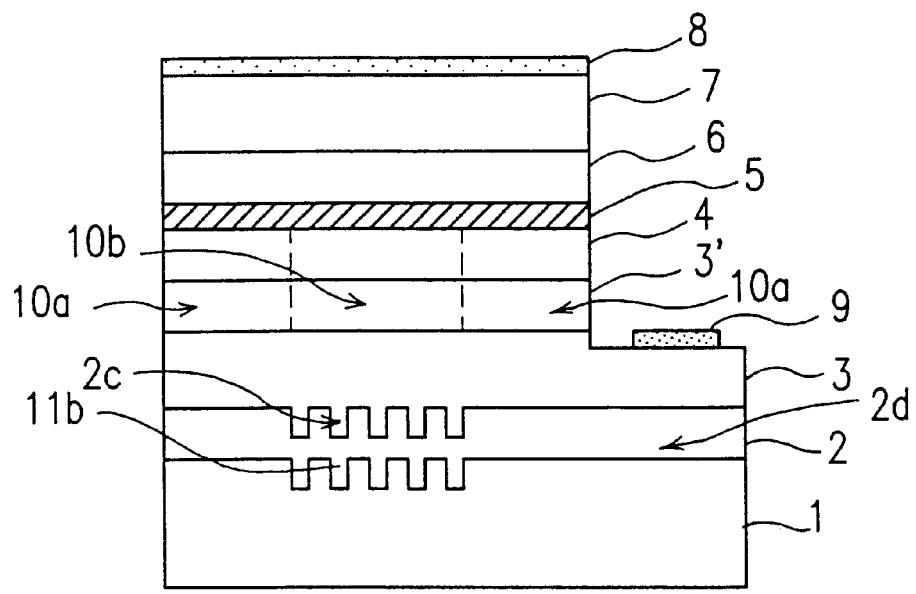
FIG. 16 is a cross-sectional view schematically illustrating the structure of a gallium nitride type compound semiconductor light-emitting device (semiconductor laser) of a current constricting type according to Embodiment 7 of the present invention.

FIG. 16 is a cross-sectional view schematically illustrating the structure of a gallium nitride type compound semiconductor laser 7000 of a current constricting type as a semiconductor light-emitting device according to Embodiment 7 of the present invention.

According to the semiconductor laser 7000, a pattern of striped concave grooves 11b, instead of the V-shaped grooves 11, are formed in a predetermined region (i.e., a processed region) with a width of about 1 μm to about 3 μm on the surface of a sapphire substrate 1. A depth of each concave groove 11b is in the range of about 10 Å to about 1000 Å, and preferably about 500 Å. A width of each concave groove 11b is in the range of about 50 Å to about 2000 Å, and preferably about 400 Å. A distance between the two adjacent concave grooves 11b (i.e., a width of a convex portion interposed between the two adjacent concave grooves 11b) is preferably about 1000 Å.

According to the above-described structure, in the same manner as in Embodiments 4 and 5, the undoped gallium nitride type compound semiconductor layers 3' and 4 have a low resistance region 10b above the processed region of the underlying substrate 1 (i.e., the region where the pattern of the striped concave grooves 11b is provided) and high resistance regions 10a above non-processed regions (i.e., the regions where the pattern of the striped concave grooves 11b is not provided). The other structure of the semiconductor laser 7000 is basically the same as that of the semiconductor laser 4000 or the semiconductor light-emitting device 5000 described in Embodiments 4 and 5, respectively. The corresponding components are denoted by the same reference numerals, and the description thereof is herein omitted.

In addition, the same effects as those described in Embodiment 4 or 5 can also be obtained in the present embodiment.

(Embodiment 8)

Figure 17:
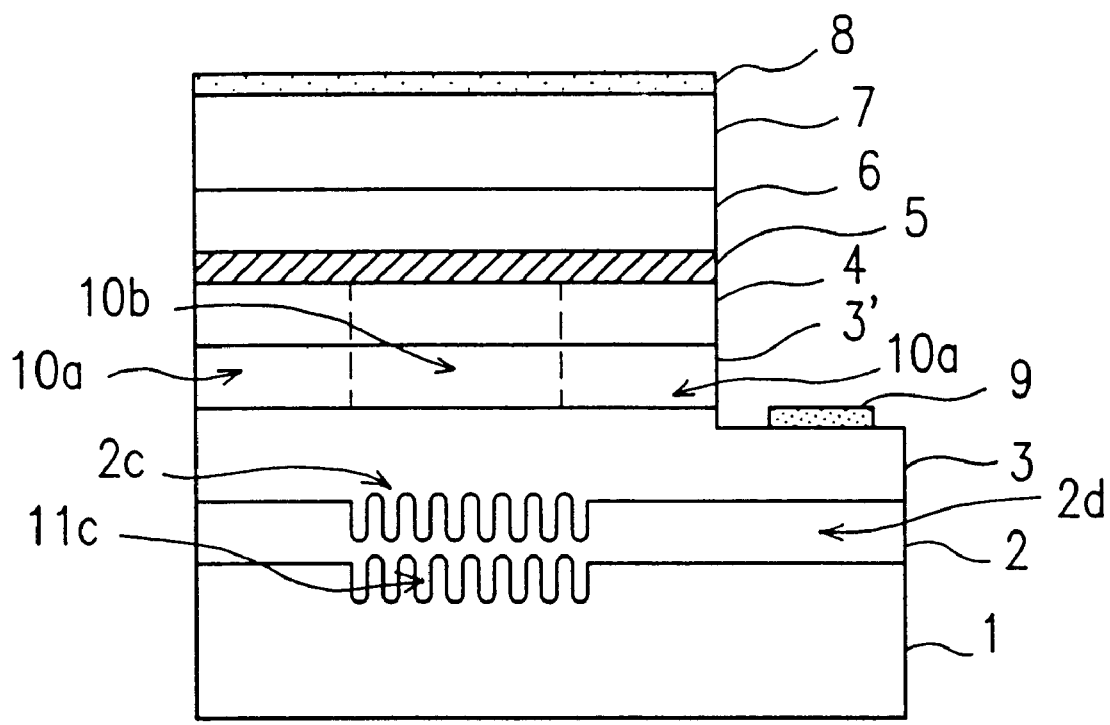
FIG. 17 is a cross-sectional view schematically illustrating the structure of a gallium nitride type compound semiconductor light-emitting device (semiconductor laser) of a current constricting type according to Embodiment 8 of the present invention.

FIG. 17 is a cross-sectional view schematically illustrating the structure of a current constricting type gallium nitride type compound semiconductor laser 8000 as a semiconductor light-emitting device according to Embodiment 8 of the present invention.

According to the semiconductor laser 8000, a pattern of striped U-shaped grooves 11c, instead of the V-shaped grooves 11, are formed in a predetermined region (i.e., a processed region) with a width of about 1 μm to about 3 μm on the surface of a sapphire substrate 1. A depth of each U-shaped groove 11c is in the range of about 10 Å to about 1000 Å, and preferably about 500 Å. A width of each U-shaped groove 11c is in the range of about 50 Å to about 2000 Å, and preferably about 800 Å. A distance between the two adjacent U-shaped grooves 11c (i.e., a width of an inverted U-shaped portion interposed between the two adjacent U-shaped grooves 11c) is preferably about 500 Å.

According to the above-described structure, in the same manner as in Embodiments 4 and 5, the undoped gallium nitride type compound semiconductor layers 3' and 4 have a low resistance region 10b above the processed region of the underlying substrate 1 (i.e., the region where the pattern of the U-shaped grooves 11c is provided) and high resistance regions 10a above non-processed regions (i.e., the regions where the pattern of the U-shaped grooves 11c is not provided). The other structure of the semiconductor laser 8000 is basically the same as that of the semiconductor laser 4000 or the semiconductor light-emitting device 5000 described in Embodiments 4 and 5, respectively. The corresponding components are denoted by the same reference numerals, and the description thereof is herein omitted.

In addition, the same effects as those described in Embodiment 4 or 5 can also be obtained in the present embodiment.

Although the $Al_dGa_{1-d}N$ ($0 \leq d \leq 1$) layer, more specifically the AlN layer, is used as the buffer layer 2 in each of the above-described embodiments, any buffer layer made of another material may be used as long as the layer has characteristics as shown in the graph of FIG. 5. For example, other compound semiconductor materials having a wurtzite structure, such as GaN, InN, ZnSe, CdTe and the like, can be used for forming the buffer layer of the present invention.

Moreover, although the sapphire substrate is used as the substrate 1 in each of the above-described embodiments, any other substrate made of another material (e.g., a SiC substrate or a GaN substrate) may be used.

Although the present invention is applied to the gallium nitride type compound semiconductor laser according to some of the embodiments of this invention, the present invention can be similarly applied to a semiconductor light-emitting diode.

According to the gallium nitride type compound semiconductor light-emitting device of this invention having the above-described characteristics, the region with a large thickness and the region with a small thickness are formed in the buffer layer, and the gallium nitride type compound semiconductor layers are formed thereon. According to such a structure, the gallium nitride type compound semiconductor layers have the high resistance region in a region above the thick buffer layer region and the low resistance region in a region above the thin buffer layer region, in accordance with the phenomenon discovered by the inventors of the present invention.

Alternatively, part of the surface of the underlying substrate is processed so as to form the striped V-shaped groove pattern, the striped U-shaped groove pattern, or the striped concave groove pattern. Thereafter, the undoped gallium nitride type compound semiconductor layers are formed on both of the processed region and the non-processed region via the buffer layer. A difference in the equivalent thickness of the buffer layer is substantially generated also in such a structure. Thus, among the undoped gallium nitride type compound semiconductor layers, a region positioned above the non-processed region of the substrate becomes the high resistance region, and a region positioned above the processed region of the substrate becomes the low resistance region.

In either case, it becomes possible to allow a part of the gallium nitride type compound semiconductor layers to function as a current blocking region, thereby realizing the gallium nitride type compound semiconductor light-emitting device of the current constricting type or the current blocking type.

According to the structure in which the buffer layer has regions having respectively different thicknesses, the regrowth interface is present on the buffer layer which is not on the current path. Thus, the presence of an impurity in the vicinity of the interface of the regrowth layer and the resultant high resistance do not adversely affect electrical characteristics. With the structure in which the processed region is provided in the underlying substrate, on the other hand, the semiconductor light-emitting device can be formed without employing a regrowth step.

Thus, in either case, the highly reliable semiconductor light-emitting device having a low driving voltage, an oscillation starting current, and excellent electrical characteristics can be realized.

As described above, according to the device structures of the present invention, the current constricting or blocking structure is formed without requiring the formation of the insulating layer or regrowth technique as in the conventional example. The light-emitting device having such a structure (e.g., the gallium nitride type compound semiconductor laser) can be fabricated easily and at a low cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gallium nitride type compound semiconductor light-emitting device, comprising:
   a substrate;
   a buffer layer, formed on an upper surface of the substrate, having a thick region and a thin region in terms of a thickness taking the upper surface of the substrate as a reference level; and
   a semiconductor layered structure, formed on an upper surface of the buffer layer, at least including an undoped gallium nitride type compound semiconductor layer, a gallium nitride type compound semiconductor active layer, and a P-type gallium nitride type compound semiconductor cladding layer.

2. A gallium nitride type compound semiconductor light-emitting device according to claim 1, wherein the thin region of the buffer layer is positioned below a light-emitting region of the gallium nitride type compound semiconductor active layer; and the thick region is positioned below a non-light-emitting region of the gallium nitride type compound semiconductor active layer.

3. A gallium nitride type compound semiconductor light-emitting device according to claim 1, wherein a portion of the undoped gallium nitride type compound semiconductor layer, which is positioned above the thick region of the buffer layer, has a carrier concentration smaller than that of a region thereof positioned above the thin region.

4. A gallium nitride type compound semiconductor light-emitting device according to claim 1, wherein the thin region of the buffer layer is formed by etching.

5. A gallium nitride type compound semiconductor light-emitting device according to claim 1, wherein the undoped gallium nitride type compound semiconductor layer is positioned closer to the substrate than the gallium nitride type compound semiconductor active layer is to the substrate.

6. A gallium nitride type compound semiconductor light-emitting device according to claim 1, wherein the undoped gallium nitride type compound semiconductor layer, the gallium nitride type compound semiconductor active layer, and the P-type gallium nitride type compound semiconductor cladding layer are crystal grown in this order on the buffer layer.

7. A gallium nitride type compound semiconductor light-emitting device according to claim 6, further comprising an N-type gallium nitride type compound semiconductor layer between the buffer layer and the undoped gallium nitride type compound semiconductor layer.

8. A gallium nitride type compound semiconductor light-emitting device according to claim 1, wherein the undoped gallium nitride type compound semiconductor layer includes an undoped gallium nitride type compound semiconductor cladding layer.

9. A gallium nitride type compound semiconductor light-emitting device according to claim 8, wherein the undoped gallium nitride type compound semiconductor layer includes a layered structure of a GaN layer and an AlGaN layer.

10. A gallium nitride type compound semiconductor light-emitting device, comprising:
    a substrate with a processed region which is processed such that an upper surface thereof has a predetermined concave and convex pattern;
    a buffer layer formed on the upper surface of the substrate; and
    a semiconductor layered structure, formed on an upper surface of the buffer layer, at least including an undoped gallium nitride type compound semiconductor layer, a gallium nitride type compound semiconductor active layer, and a P-type gallium nitride type compound semiconductor cladding layer.

11. A gallium nitride type compound semiconductor light-emitting device according to claim 10, wherein the processed region of the substrate is positioned below a light-emitting region of the gallium nitride type compound semiconductor active layer.

12. A gallium nitride type compound semiconductor light-emitting device according to claim 10, wherein a portion of the undoped gallium nitride type compound semiconductor layer, which is positioned above the processed region of the substrate, has a resistivity smaller than that of a portion thereof positioned above a non-processed region.

13. A gallium nitride type compound semiconductor light-emitting device according to claim 10, wherein the undoped gallium nitride type compound semiconductor layer is positioned closer to the substrate than the gallium nitride type compound semiconductor active layer is to the substrate.

14. A gallium nitride type compound semiconductor light-emitting device according to claim 10, wherein the undoped gallium nitride type compound semiconductor layer, the gallium nitride type compound semiconductor active layer, and the P-type gallium nitride type compound semiconductor cladding layer are crystal grown in this order on the buffer layer.

15. A gallium nitride type compound semiconductor light-emitting device according to claim 14, further comprising an N-type gallium nitride type compound semiconductor layer between the buffer layer and the undoped gallium nitride type compound semiconductor layer.

16. A gallium nitride type compound semiconductor light-emitting device according to claim 10, wherein the undoped gallium nitride type compound semiconductor layer includes an undoped gallium nitride type compound semiconductor cladding layer.

17. A gallium nitride type compound semiconductor light-emitting device according to claim 16, wherein the undoped gallium nitride type compound semiconductor layer includes a layered structure of a GaN layer and an AlGaN layer.

18. A gallium nitride type compound semiconductor light-emitting device, comprising:

a substrate;

a buffer layer formed on the substrate;

a semiconductor layered structure, formed on the buffer layer, at least including a gallium nitride type compound semiconductor layer and an active layer;

wherein an upper surface of the buffer layer has a difference of elevation in terms of a thickness taking an upper surface of the substrate as a reference level.

19. A gallium nitride type compound semiconductor light-emitting device according to claim 18, wherein the gallium nitride type compound semiconductor layer has first and second regions such that an average thickness of the first region is greater than an average thickness of the second region.

20. A gallium nitride type compound semiconductor light-emitting device according to claim 19, wherein a light-emitting region is positioned on the first region.

* * * * *